United States Patent
Hirose et al.

(10) Patent No.: US 8,836,034 B2
(45) Date of Patent: Sep. 16, 2014

(54) SEMICONDUCTOR DEVICE

(75) Inventors: Atsushi Hirose, Kanagawa (JP); Hideaki Shishido, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 339 days.

(21) Appl. No.: 12/817,481

(22) Filed: Jun. 17, 2010

(65) Prior Publication Data

US 2010/0328916 A1   Dec. 30, 2010

(30) Foreign Application Priority Data

Jun. 29, 2009   (JP) .................................. 2009-154099

(51) Int. Cl.
   *H01L 23/62*   (2006.01)
(52) U.S. Cl.
   USPC .... 257/355; 257/360; 257/361; 257/E29.328; 257/E29.332
(58) Field of Classification Search
   USPC .......... 257/355, 360, 361, E29.328, E29.335, 257/E29.332, E27.051; 438/133
   See application file for complete search history.

(56) References Cited

U.S. PATENT DOCUMENTS

| | | | | |
|---|---|---|---|---|
| 4,839,768 | A * | 6/1989 | Daniele et al. | 361/56 |
| 6,081,012 | A * | 6/2000 | Hiraga | 257/355 |
| 6,338,986 | B1 * | 1/2002 | Kawazoe et al. | 438/133 |
| 6,844,596 | B2 | 1/2005 | Ohnakado | |
| 6,943,412 | B1 * | 9/2005 | Horiguchi | 257/360 |
| 2002/0033504 | A1 * | 3/2002 | Ohnakado | 257/350 |
| 2002/0190313 | A1 * | 12/2002 | Takaishi et al. | 257/330 |
| 2003/0227020 | A1 * | 12/2003 | Huang et al. | 257/79 |
| 2005/0274956 | A1 * | 12/2005 | Bhat | 257/79 |
| 2006/0017139 | A1 | 1/2006 | Eguchi et al. | |
| 2006/0193093 | A1 | 8/2006 | Bertin et al. | |
| 2006/0284322 | A1 * | 12/2006 | Hashimoto | 257/782 |
| 2008/0316342 | A1 * | 12/2008 | Rossi | 348/294 |
| 2009/0310265 | A1 * | 12/2009 | Fukuoka et al. | 361/54 |
| 2009/0321869 | A1 * | 12/2009 | Fukuoka et al. | 257/461 |

FOREIGN PATENT DOCUMENTS

| | | | | |
|---|---|---|---|---|
| JP | 59-086252 | A | | 5/1984 |
| JP | 04-094164 | A | | 3/1992 |
| JP | 05029636 | A | * | 2/1993 ............ H01L 29/861 |
| JP | 2002-100761 | A | | 4/2002 |
| JP | 2006-060191 | A | | 3/2006 |

OTHER PUBLICATIONS

Chinese Office Action (CN Application No. 201010212353.X) dated Dec. 23, 2013 with English translation.

* cited by examiner

*Primary Examiner* — Mamadou Diallo
(74) *Attorney, Agent, or Firm* — Fish & Richardson P.C.

(57) ABSTRACT

A protection circuit used for a semiconductor device is made to effectively function and the semiconductor device is prevented from being damaged by a surge. A semiconductor device includes a terminal electrode, a protection circuit, an integrated circuit, and a wiring electrically connecting the terminal electrode, the protection circuit, and the integrated circuit. The protection circuit is provided between the terminal electrode and the integrated circuit. The terminal electrode, the protection circuit, and the integrated circuit are connected to one another without causing the wiring to branch. It is possible to reduce the damage to the semiconductor device caused by electrostatic discharge. It is also possible to reduce faults in the semiconductor device.

23 Claims, 23 Drawing Sheets

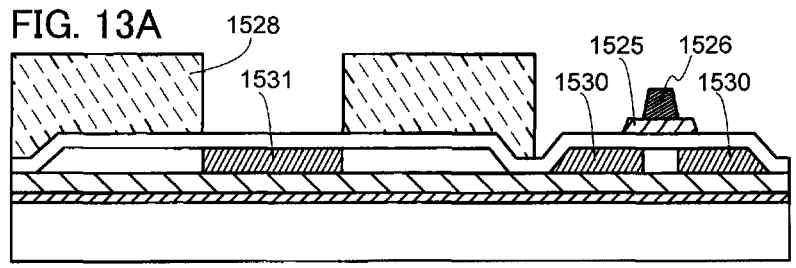
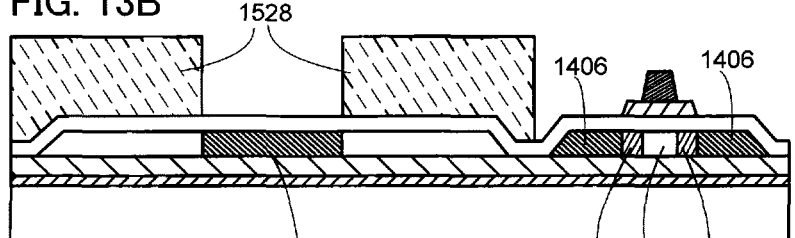
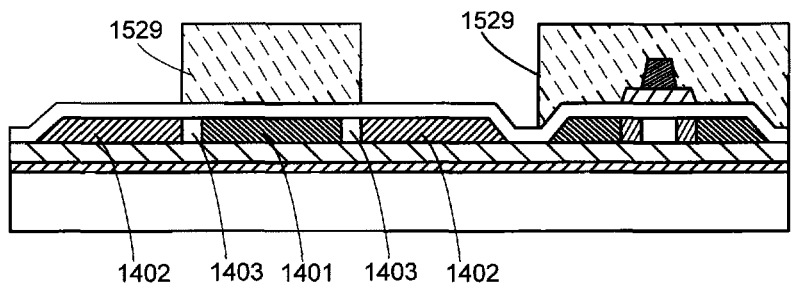
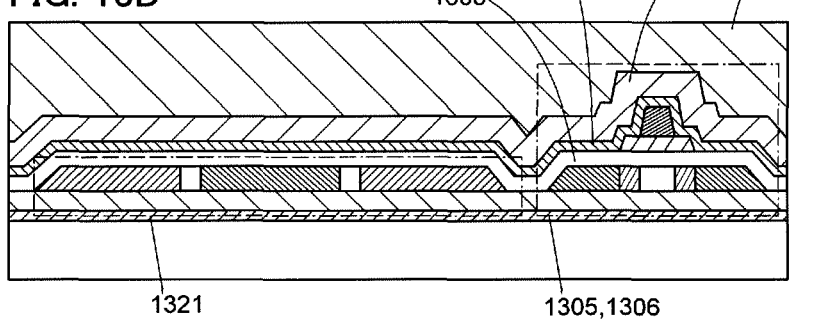

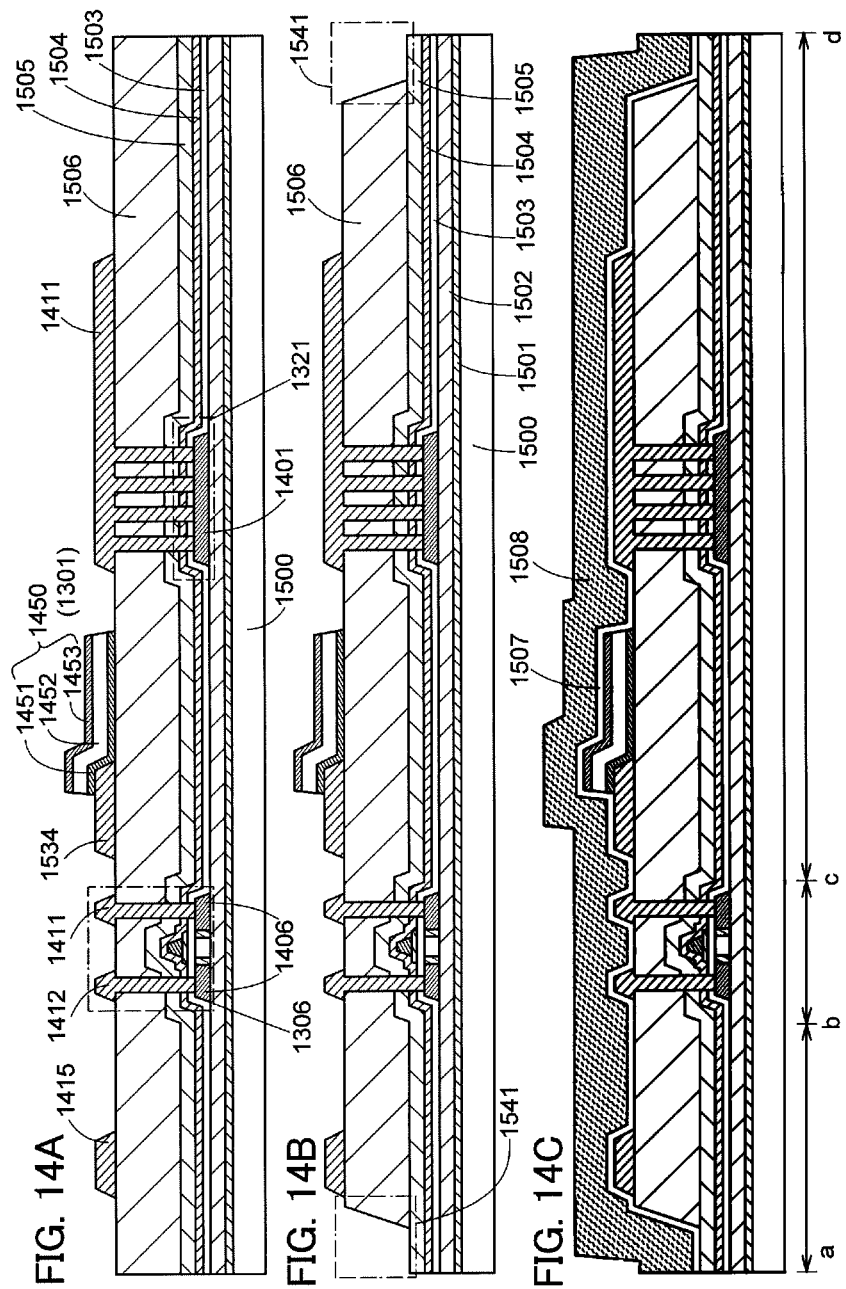

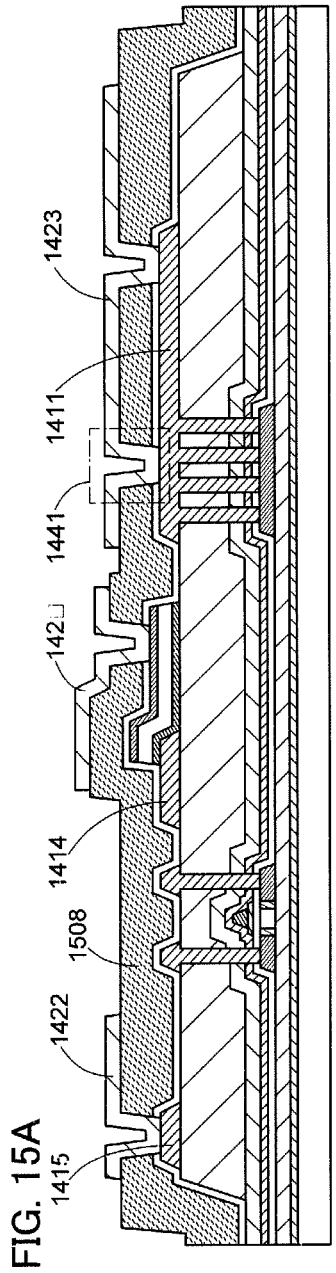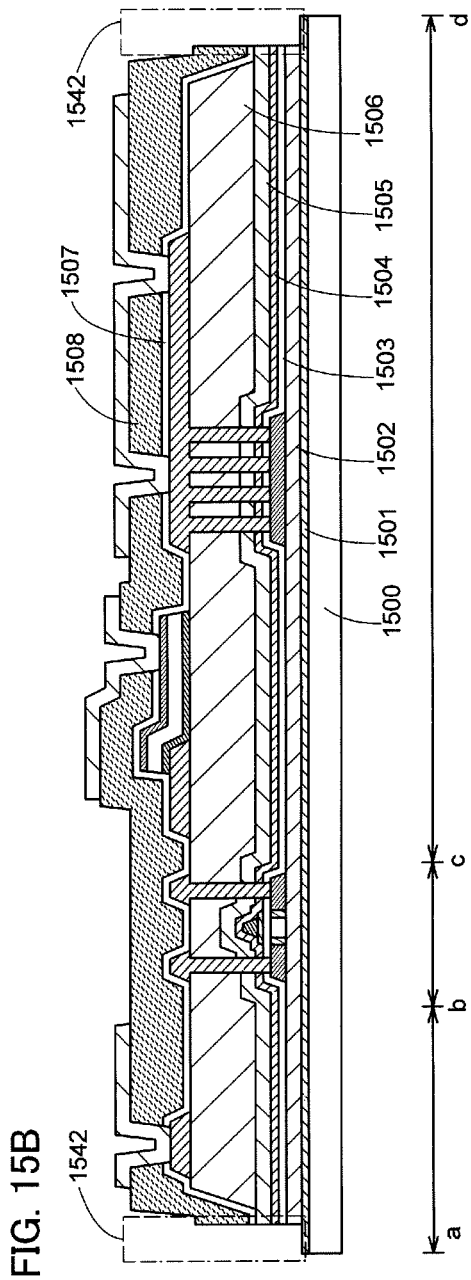

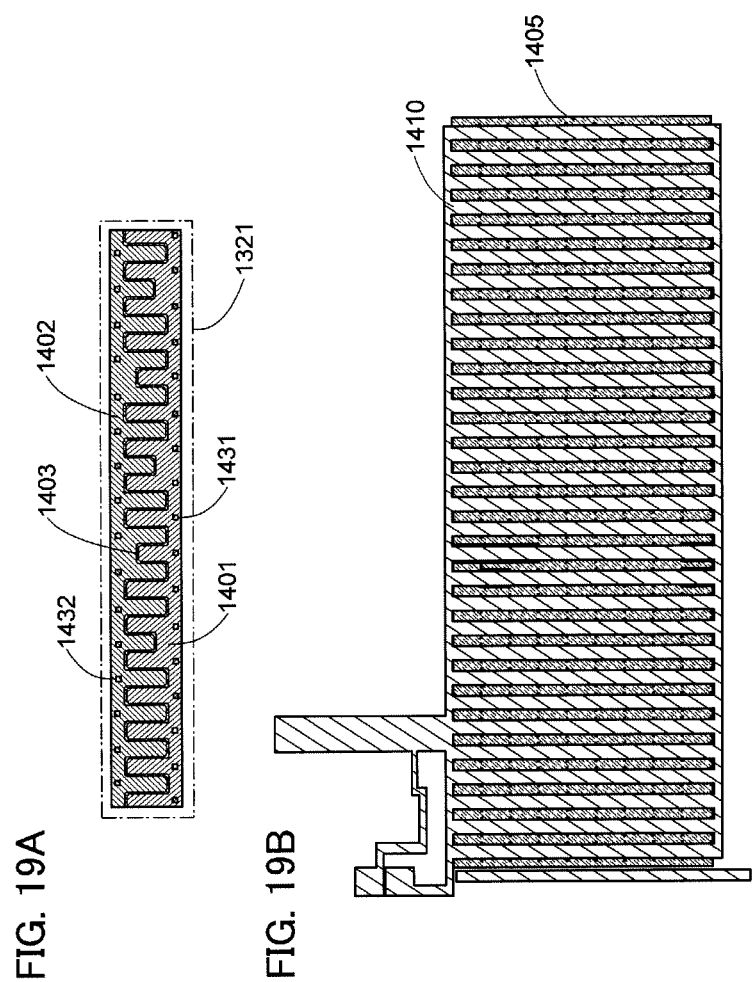

FIG. 22B
FIG. 22A
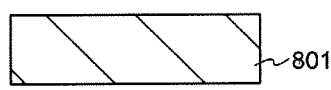
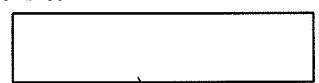
FIG. 22C
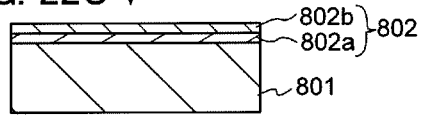
FIG. 22D
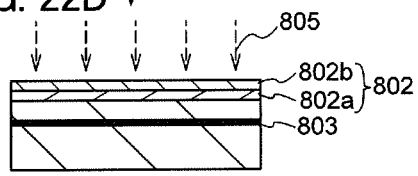
FIG. 22E
FIG. 22F
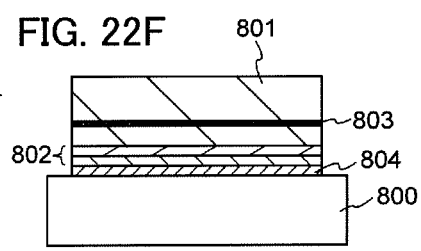
FIG. 22G
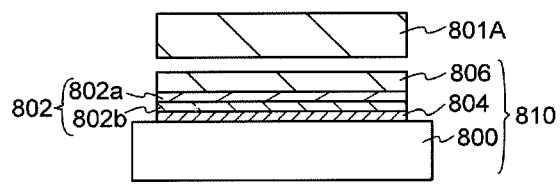

SEMICONDUCTOR DEVICE

BACKGROUND OF THE INVENTION

1. Field of the Invention

The present invention relates to a semiconductor device provided with a means of preventing a circuit from being damaged by unexpected high-voltage application such as electrostatic discharge.

2. Description of the Related Art

One of the main causes of the fault of integrated circuits is damage to a semiconductor element, an electrode, or the like due to electrostatic discharge (hereinafter referred to as "ESD"). In view of this, a protection circuit is provided between a terminal and an integrated circuit in order to prevent damage to the integrated circuit caused by ESD. A protection circuit is a circuit for preventing overvoltage or overcurrent called a surge or spike (hereinafter referred to as a surge), which occurs at the time of ESD phenomenon and exceeds the rating, from being supplied to an integrated circuit. Typical examples of an element used for a protection circuit include a resistor, a diode, and a capacitor.

For example, References 1 and 2 disclose that a diode is formed using a semiconductor layer formed over an insulating film and is used as an element for a protection circuit. In Reference 1, a lateral diode obtained by laterally forming a PN junction in a polysilicon film is provided between a high-frequency input-output signal line and an external power source VDD. In Reference 2, a PIN diode formed using a semiconductor layer is used as a protection element. Providing a floating electrode which faces an i-type layer of the PIN diode makes a p-type layer (or an n-type layer) of the PIN diode and the floating electrode short-circuited when a gate insulating film is damaged by overcurrent flowing through the protection circuit element and is electrically penetrated.

REFERENCE

[Patent Document 1] Japanese Published Patent Application No. 2002-100761
[Patent Document 2] Japanese Published Patent Application No. 2006-060191

SUMMARY OF THE INVENTION

One embodiment of the present invention provides a semiconductor device with fewer faults.

An embodiment of the present invention includes a terminal electrode, a protection circuit, an integrated circuit, and a wiring electrically connecting the terminal electrode, the protection circuit, and the integrated circuit. The protection circuit is provided between the terminal electrode and the integrated circuit. The terminal electrode, the protection circuit, and the integrated circuit are connected to one another without causing the wiring to branch. This reduces the adverse effect of the surge on the integrated circuit.

An embodiment of the present invention includes a terminal electrode, a protection circuit, an integrated circuit, and a wiring electrically connecting the terminal electrode, the protection circuit, and the integrated circuit. The protection circuit is provided between the terminal electrode and the integrated circuit without causing the wiring to branch. This makes the protection circuit effectively function and reduces the adverse effect of the surge on the integrated circuit.

An embodiment of the present invention is a semiconductor device that includes a terminal electrode, a protection circuit, an integrated circuit, and a wiring electrically connecting the terminal electrode, the protection circuit, and the integrated circuit. The protection circuit is provided between the terminal electrode and the integrated circuit. The terminal electrode, the protection circuit, and the integrated circuit are connected to one another without causing the wiring to branch. The protection circuit is controlled in accordance with a signal input to the terminal electrode.

Note that in an embodiment of the present invention, power supply voltage can be applied to the terminal electrode.

An embodiment of the present invention is a semiconductor device that includes at least a first terminal electrode, a second terminal electrode, a first wiring, a second wiring, a protection circuit, and an integrated circuit. The first terminal electrode is electrically connected to a part (a first region) of the integrated circuit through the first wiring. The second terminal electrode is electrically connected to another part (a second region) of the integrated circuit through the second wiring. At least a part of the first wiring placed between the first terminal electrode and the integrated circuit is electrically connected to a part (a first portion) of the protection circuit without branching. At least a part of the second wiring placed between the second terminal electrode and the integrated circuit is electrically connected to another part (a second portion) of the protection circuit without branching. The protection circuit is controlled in accordance with a potential difference between the potential of the first wiring and the potential of the second wiring.

Note that in an embodiment of the present invention, power supply voltage can be applied to the first wiring.

Further, in an embodiment of the present invention, the protection circuit can include a semiconductor film having an n-type impurity region and a p-type impurity region.

An embodiment of the present invention is a semiconductor device that includes at least a first terminal electrode, a second terminal electrode, a first wiring, a second wiring, a third wiring, a protection circuit, and an integrated circuit. The first terminal electrode is electrically connected to a part (a first region) of the integrated circuit through the first wiring. The second terminal electrode is electrically connected to another part (a second region) of the integrated circuit through the second wiring. The third wiring is electrically connected to the second wiring. The first terminal electrode and the third wiring overlap with each other with an insulating film therebetween. At least a part of the first wiring placed between the first terminal electrode and the integrated circuit is electrically connected to a part (a first portion) of the protection circuit without branching. At least a part of the second wiring placed between the second terminal electrode and the integrated circuit is electrically connected to another part (a second portion) of the protection circuit without branching. The protection circuit is controlled in accordance with a potential difference between the potential of the first wiring and the potential of the second wiring.

Further, an embodiment of the present invention is an electronic device that includes the above-described semiconductor device.

It is possible to inhibit the damage to the semiconductor device caused by electrostatic discharge. It is also possible to reduce faults in the semiconductor device.

BRIEF DESCRIPTION OF THE DRAWINGS

FIGS. 13A to 13D are cross-sectional views showing the manufacturing method of the semiconductor device of an embodiment of the present invention.

FIGS. 14A to 14C are cross-sectional views showing the manufacturing method of the semiconductor device of an embodiment of the present invention.

FIGS. 15A and 15B are cross-sectional views showing the manufacturing method of the semiconductor device of an embodiment of the present invention.

FIGS. 19A and 19B are plane views showing the manufacturing method of the semiconductor device of an embodiment of the present invention.

FIGS. 22A to 22G are cross-sectional views showing the manufacturing method of the semiconductor device of an embodiment of the present invention.

DETAILED DESCRIPTION OF THE INVENTION

Figure 1A:
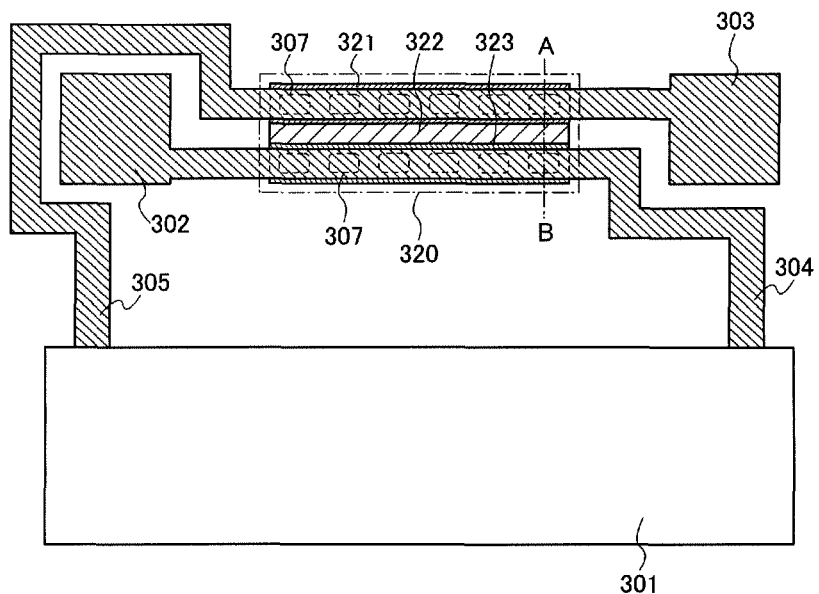
FIGS. 1A and 1B show a semiconductor device in an embodiment of the present invention.

Hereinafter, the present invention will be described with reference to drawings. Note that the present invention can be implemented in various different ways and it will be readily appreciated by those skilled in the art that various changes and modifications are possible without departing from the spirit and scope of the present invention. Thus, the present invention should not be interpreted as being limited to the description in the embodiment modes and embodiments to be given below. Further, the same elements are denoted by the same reference numerals through the drawings. Therefore, the description of the same elements will be not repeated in the description hereinbelow.

Embodiment 1

In what follows, an embodiment of the present invention will be described with reference to FIGS. 1A and 1B. FIG. 1A shows a connection among an integrated circuit 301 including a plurality of semiconductor elements, a terminal electrode 302, a terminal electrode 303, and a protection circuit 320. Each of the terminal electrode 302 and the terminal electrode 303 is an output terminal or an input terminal of a semiconductor device and is a connection portion to another semiconductor device. For example, the terminal electrode 302 and the terminal electrode 303 each serve as a power supply terminal, a signal output terminal, or a signal input terminal.

Note that in this specification, description such as "A is provided on B" does not necessarily mean that B is provided on and in direct contact with A unless otherwise specifically stated. For example, the case where another object is provided between A and B in the cross-sectional view is also included. Here, A and B each correspond to an object (e.g., a device, an element, a circuit, a wiring, an electrode, a terminal, a film, a layer, or the like).

Similarly, description such as "A is provided below B" does not necessarily mean that A is provided under and in direct contact with B. For example, the case where another object is provided between A and B in the cross-sectional view is also included.

The terminal electrode 302 and the integrated circuit 301 are connected to each other by a wiring 304, and the protection circuit 320 is connected to a part of the wiring 304, between the terminal electrode 302 and the integrated circuit 301. Further, the terminal electrode 303 and the integrated circuit 301 are connected to each other by a wiring 305, and the protection circuit 320 is connected to a part of the wiring 305, between the terminal electrode 303 and the integrated circuit 301. That is, signals input to the terminal electrode 302 and the terminal electrode 303 always go through the protection circuit 320 before being transmitted to the integrated circuit 301 since between the terminal electrode 302 and the integrated circuit 301, and between the terminal electrode 303 and the integrated circuit 301, the protection circuit 320 is provided without causing the wiring 304 and the wiring 305 to branch.

Figure 1B:
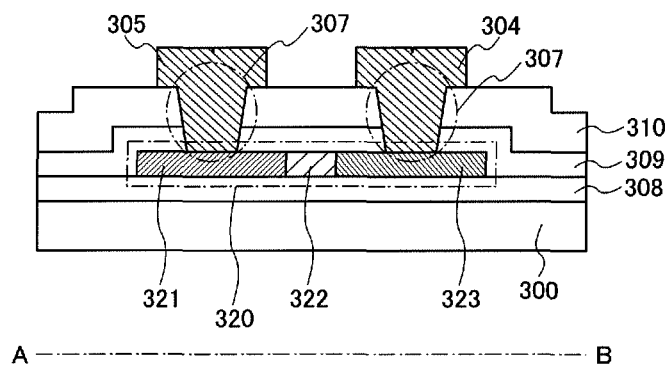

FIG. 1B shows a cross-sectional structure of the protection circuit 320 in this embodiment. The protection circuit 320 is formed over a substrate 300 with an insulating film 308 therebetween. As the substrate 300, any of the following substrates can be used: a semiconductor substrate, a glass substrate, a quartz substrate, a sapphire substrate, a ceramics substrate, a stainless steel substrate, a metal substrate, a resin substrate, a resin film, a sheet that is a fabric of carbon fiber or glass fiber impregnated with resin (so-called, prepreg), and the like. A non-alkali glass substrate is preferably used as a glass substrate. Examples of the non-alkali glass substrate include an aluminosilicate glass substrate, an aluminoborosilicate glass substrate, a barium borosilicate glass substrate, and the like.

The insulating film 308 has a single or multi-layer structure having any of a silicon oxide film, a silicon nitride film, a silicon oxynitride film, and a silicon nitride oxide film. In this embodiment, a silicon oxynitride film is used. A halogen element such as fluorine or chlorine may be added in small numbers to the insulating film 308 to immobilize mobile ions of sodium or the like. The concentration of a halogen element to be contained in the insulating film preferably has a peak ranging from $1\times10^{15}$ cm$^{-3}$ to $1\times10^{20}$ cm$^{-3}$ when measured by SIMS (secondary ion mass spectrometry).

The protection circuit 320 is, for example, a lateral diode formed using a semiconductor layer including a p-type impurity region 321, a high-resistance region 322, and an n-type impurity region 323. The high-resistivity region 322 can be formed using an intrinsic semiconductor (an i-type semiconductor), for example. Although an intrinsic semiconductor is ideally a semiconductor whose Fermi level is positioned substantially in the center of a forbidden band, here, an intrinsic semiconductor also refers to a semiconductor whose Fermi level is positioned in the center of the forbidden band by intentionally adding an impurity which serves as a donor or an acceptor to the semiconductor. In this embodiment, although the semiconductor layer is formed using a silicon film, the semiconductor layer can alternatively be formed using a semiconductor such as germanium, silicon germanium, or carbon silicon.

The wiring 304 is connected to the n-type impurity region 323 through a single or plurality of openings 307 provided in an insulating film 309 and an insulating film 310 which cover the protection circuit 320. The wiring 305 is connected to the p-type impurity region 321 through a single or plurality of openings 307 provided in the insulating film 309 and the insulating film 310 which cover the protection circuit 320. The insulating film 309 and the insulating film 310 each can be formed using a silicon oxide film, a silicon nitride film, a silicon oxynitride film, or the like.

A halogen element such as fluorine or chlorine may be added in small numbers to the insulating film 309 and the insulating film 310 to immobilize mobile ions of sodium or the like. The concentration of a halogen element to be contained in the insulating films preferably has a peak ranging from $1\times10^{15}$ cm$^{-3}$ to $1\times10^{20}$ cm$^{-3}$ when measured by SIMS (secondary ion mass spectrometry).

Each of the wiring 304 and the wiring 305 can be formed using a metal film, an alloy film, a metal compound film, or the like, that contains an elemental metal selected from tantalum, tungsten, titanium, molybdenum, aluminum, chromium, niobium, gold, silver, copper, platinum, and the like, as its main component. Here, each of the wiring 304 and the wiring 305 has a three-layer structure where an aluminum film is sandwiched between titanium films. The resistance of a multi-layer structure having a titanium film, an aluminum film, and a titanium film is low. Further, since the aluminum film is sandwiched between the titanium films, a hillock formation resulting from the aluminum film is less likely to occur.

Figure 4A:
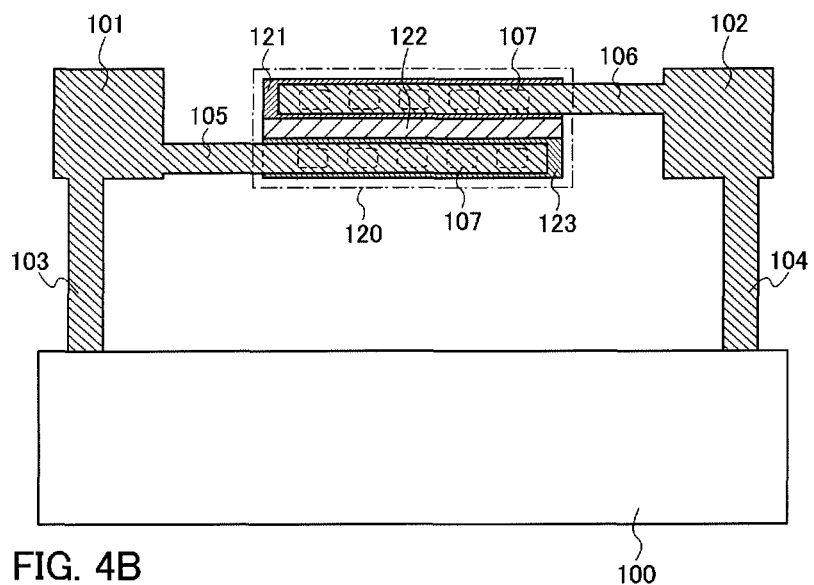
FIGS. 4A and 4B each show a conventional semiconductor device.
Figure 4B:
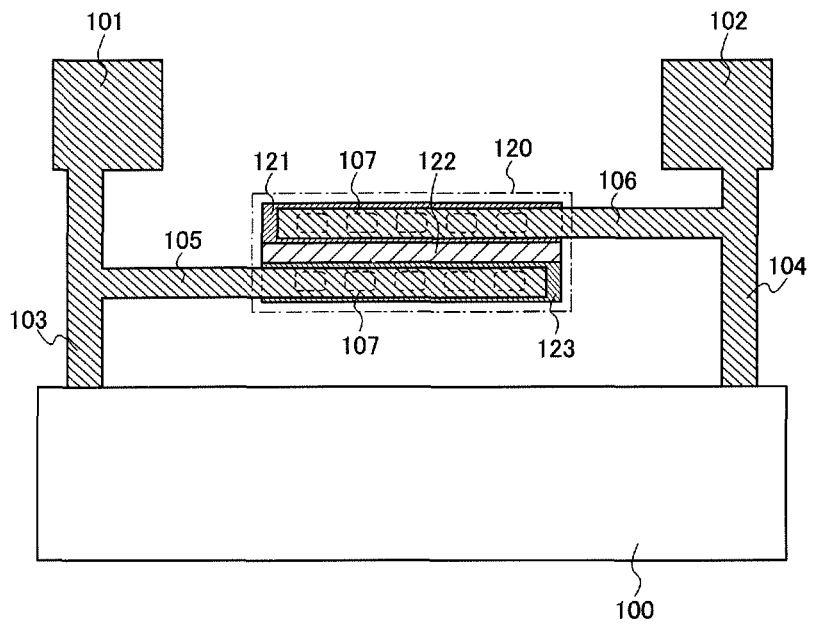

Now, a conventional example of a semiconductor device is described with reference to FIGS. 4A and 4B. FIGS. 4A and 4B each show a connection between an integrated circuit 100 including a plurality of semiconductor elements, a terminal electrode 101, a terminal electrode 102, and a protection circuit 120. Each of the terminal electrode 101 and the terminal electrode 102 is an output terminal or an input terminal of a semiconductor device and is a connection portion to another semiconductor device. For example, the terminal electrode 101 and the terminal electrode 102 each serve as a power supply terminal, signal output terminals, or signal input terminals.

Note that in general, a voltage refers to a difference between potentials of two points, and a potential refers to electrostatic energy (electric potential energy) that a unit charge at a point in an electrostatic field has, while in this specification, when a difference between a potential at a point and a reference potential (e.g., a ground potential) is referred to as a potential at the point, the potential at the point is also referred to as a voltage unless otherwise specifically stated. This is because in an electronic circuit, a potential difference between a potential at a point and a reference potential (e.g., a ground potential) is often referred to as a voltage at the point.

The protection circuit 120 is a circuit for preventing overvoltage from being applied to the integrated circuit 100 and preventing the integrated circuit 100 from being damaged by the surge. FIGS. 4A and 4B each show the case where a diode, which is a rectifier, is used as the protection circuit 120 and each show an example of a lateral diode formed using a semiconductor layer including a p-type impurity region 121, a high-resistance region 122, and an n-type impurity region 123. When the terminal electrode 101 is a higher power supply terminal and the terminal electrode 102 is a lower power supply terminal, the cathode of the diode is connected to the terminal electrode 101 and the anode of the diode is connected to the terminal electrode 102. Thus, although little current flows through the protection circuit 120 while the semiconductor device normally operates, the protection circuit 120 provides conduction (a short) between the terminal electrode 101 and the terminal electrode 102 when a voltage greater than a voltage applied to the terminal electrode 101 is applied to the terminal electrode 102. Further, also in the case where a voltage greater than a voltage applied to the terminal electrode 102 is applied to the terminal electrode 101, the protection circuit 120 provides conduction (a short) between the terminal electrode 101 and the terminal electrode 102 if a voltage that equals or exceeds a given voltage (e.g., a breakdown voltage of a diode) is applied to the terminal electrode 101. In such a manner, the integrated circuit 100 can be prevented from being damaged by the surge.

In FIG. 4A, the terminal electrode 101 and the integrated circuit 100 are connected to each other by a wiring 103, and the terminal electrode 101 and the n-type impurity region 123 included in the protection circuit 120 are connected to each other by a wiring 105 through openings 107 provided in an insulating film (not shown). Further, the terminal electrode 102 and the integrated circuit 100 are connected to each other by a wiring 104, and the terminal electrode 102 and the p-type impurity region 121 included in the protection circuit 120 are connected to each other by the wiring 106 through the openings 107 provided in an insulating film (not shown). That is, one of two wirings which branch from the terminal electrode 101 connects the terminal electrode 101 and the integrated circuit 100, and the other connects the terminal electrode 101 and the protection circuit 120; and one of two wirings which branch from the terminal electrode 102 connects the terminal electrode 102 and the integrated circuit 100, and the other connects the terminal electrode 102 and the protection circuit 120.

In FIG. 4B, the terminal electrode 101 and the integrated circuit 100 are connected to each other by the wiring 103, while the terminal electrode 101 and the protection circuit 120 are connected to each other by the wiring 105 which branches from the wiring 103. Further, the terminal electrode 102 and the integrated circuit 100 are connected to each other by the wiring 104, while the terminal electrode 102 and the protection circuit 120 are connected to each other by the wiring 106 which branches from the wiring 104.

In both FIG. 4A and FIG. 4B, a path by which the terminal is connected to the integrated circuit and a path by which the terminal is connected to the protection circuit are different.

This causes a surge travelling through the terminal to be separately supplied to the integrated circuit and the protection circuit, which prevents the protection circuit from fully functioning.

According to this embodiment, by providing the protection circuit 320 between the terminal electrode 302 and the integrated circuit 301, and between the terminal electrode 303 and the integrated circuit 301 without causing the wiring 304 and the wiring 305 to branch, a surge travelling through the terminal electrode 302 or the terminal electrode 303 always goes through the protection circuit 320, which makes it possible to efficiently reduce the adverse effect of the surge on the integrated circuit 301.

Here, an example of contrivance to route the wirings is described. In FIG. 1A, the terminal electrode 302, the terminal electrode 303, the wiring 304, and the wiring 305 are formed using the same conductive layer. Therefore, the wiring 305 need go around the terminal electrode 302 to be connected to the integrated circuit 301. Although there is no problem if the semiconductor device has enough space (margin) in a plane view, the wirings need be efficiently routed in view of a high integration.

So an example in which a part of the wiring 305 is replaced with another conductive layer and the wiring 305 is thus allowed to cross the wiring 304, resulting in the efficient routing in the plane view of the semiconductor device and the efficient utilization of the space will be described with reference to FIGS. 2A and 2B.

Figure 2A:
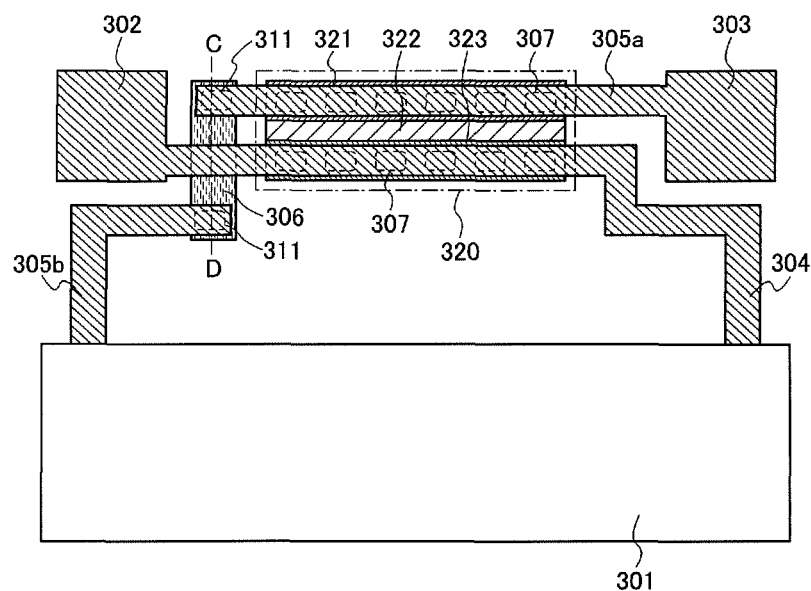
FIGS. 2A and 2B show a semiconductor device in an embodiment of the present invention.

FIG. 2A shows a plane structure of a semiconductor device. The wiring 305 for connecting the terminal electrode 303, the protection circuit 320, and the integrated circuit 301 is divided into a wiring 305a and a wiring 305b, and the wiring 305a and the wiring 305b are electrically connected to each other through a wiring 306 formed using another conductive layer.

Figure 2B:
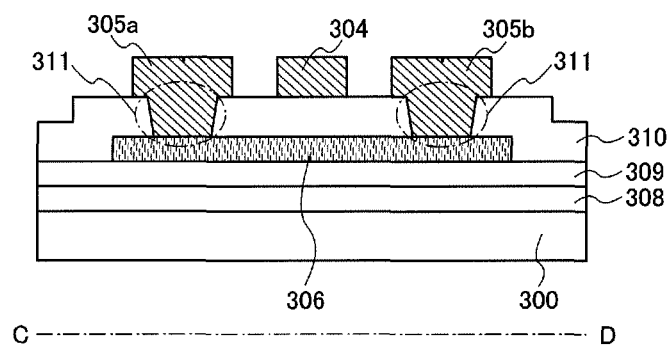

FIG. 2B shows a cross-sectional structure of a connection portion between the wiring 305a, the wiring 305b, and the wiring 306, which is shown by a line C-D in FIG. 2A. Each of the wiring 305a and the wiring 305b is electrically connected to the wiring 306, which is formed using another conductive layer, through openings 311 provided in the insulating film 310. Although here, the wiring 306 is shown as being below the wiring 305, a conductive layer that is above the wiring 305 may alternatively be used as the wiring 306.

Such a structure allows the wiring 305 and the wiring 304 to cross each other without short-circuiting them, leading to the efficient utilization of the space.

Note that even if the wiring 305 is routed in such a manner, since the protection circuit 320 is substantially provided between the terminal electrode 302 and the integrated circuit 301, and between the terminal electrode 303 and the integrated circuit 301 without causing the wiring 304 and the wiring 305 to branch, a surge travelling through the terminal electrode 302 or the terminal electrode 303 always goes through the protection circuit 320, which makes it possible to efficiently reduce the adverse effect of the surge on the integrated circuit 301.

Next, calculation results of a voltage applied to the integrated circuit in the case where a surge travelling through the semiconductor device are described with reference to FIGS. 5A and 5B and are shown with reference to FIGS. 6A and 6B.

Figure 5A:
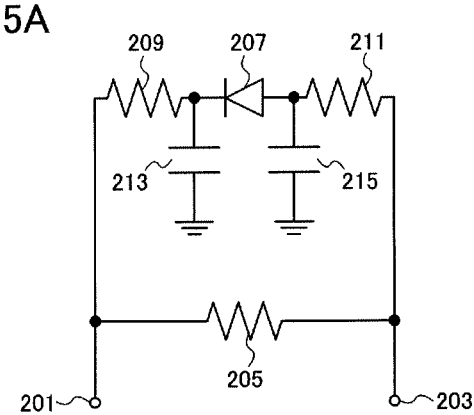
FIG. 5A shows an equivalent circuit diagram of a conventional semiconductor device and FIG. 5B shows an equivalent circuit diagram of a semiconductor device of an embodiment of the present invention.

FIG. 5A shows an equivalent circuit diagram of the conventional semiconductor device shown in FIGS. 4A and 4B. FIG. 5B shows an equivalent circuit diagram of the semiconductor device in this embodiment.

Note that the equivalent circuit takes into consideration the fact that a variety of parasitic resistances, parasitic capacitances or the like exists in an actual layout even if only the integrated circuit and the protection circuit are included in the semiconductor device at the design phase.

In an equivalent circuit shown in FIG. 5A, each of a parasitic resistance 209 and a parasitic capacitance 213 is connected between a terminal electrode 201 and a protection circuit 207, and an integrated circuit 205 is connected between the terminal electrode 201 and the parasitic resistance 209. Further, each of a parasitic resistance 211 and a parasitic capacitance 215 is connected between a terminal electrode 203 and the protection circuit 207, and the integrated circuit 205 is connected between the terminal electrode 203 and the parasitic resistance 211.

Figure 5B:
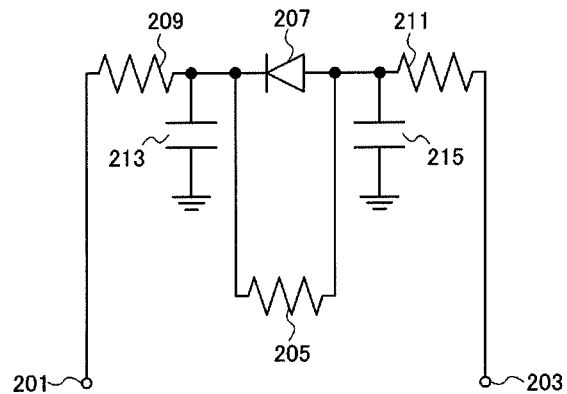

In an equivalent circuit shown in FIG. 5B, each of the parasitic resistance 209 and the parasitic capacitance 213 is connected between the terminal electrode 201 and the protection circuit 207, and the integrated circuit 205 is connected between the parasitic resistance 209 and the protection circuit 207. Further, each of a parasitic resistance 211 and a parasitic capacitance 215 is connected between a terminal electrode 203 and the protection circuit 207, and the integrated circuit 205 is connected between the parasitic resistance 211 and the protection circuit 207.

Figure 6A:
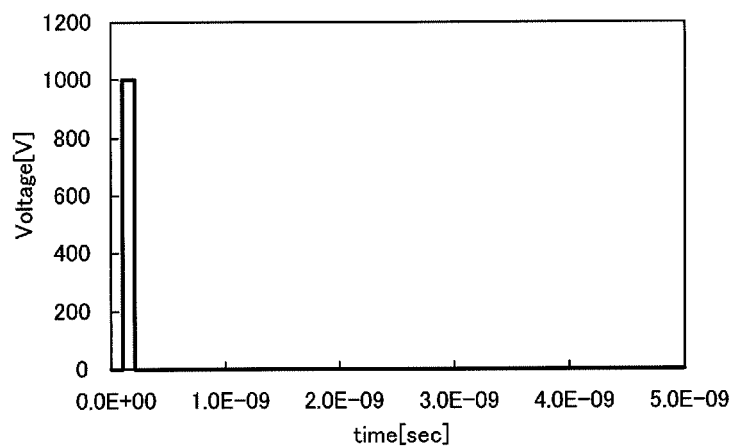
FIG. 6A shows circuit calculation results of a conventional semiconductor device and FIG. 6B shows circuit calculation results of a semiconductor device of an embodiment of the present invention.
Figure 6B:
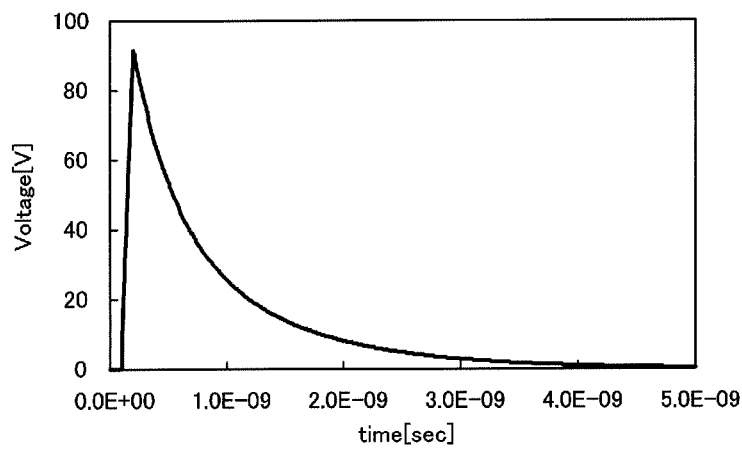

FIGS. 6A and 6B show circuit calculation results of the semiconductor device in this embodiment and the conventional semiconductor device in FIGS. 4A and 4B. Note that the calculation was performed by using a Smart Spice circuit simulator produced by Silvaco, Inc. In addition, here, a voltage applied to the integrated circuit 205 in the case where the terminal electrode 203 is grounded and a pulse of 1 kV is input to the terminal electrode 201 for 100 psec was calculated. In FIGS. 6A and 6B, the horizontal axis denotes a time and the vertical axis denotes a voltage applied to the integrated circuit 205.

As shown in FIG. 6A, in the conventional semiconductor device shown in FIGS. 4A and 4B, a pulse voltage input is applied to the integrated circuit 205. The terminal electrode 201 and the terminal electrode 203 are directly connected to the integrated circuit 205, and a surge travelling through the terminal electrode 201 is divided and supplied to the integrated circuit 205 and the protection circuit 207, which prevents the protection circuit 207 from fully functioning.

However, as shown in FIG. 6B, the voltage applied to the integrated circuit 205 is found to be reduced in the semiconductor device in this embodiment. This is because the terminal electrode 201 and the terminal electrode 203 are not directly connected to the integrated circuit 205 but are connected to the integrated circuit 205 through the parasitic resistance 209, the parasitic resistance 211, the parasitic capacitance 213, and the parasitic capacitance 215; therefore, a voltage applied to the terminal electrode 201 is transmitted to the parasitic resistance 209 and the parasitic capacitance 213 before being transmitted to the integrated circuit 205; thus, these parasitic resistances or parasitic capacitances produce time delay. As a result, a sudden increase in the voltage applied to the integrated circuit 205 is prevented.

As described above, the semiconductor device in this embodiment makes it possible to efficiently reduce the adverse effect of the surge on the integrated circuit.

Embodiment 2

Although a protection circuit is for preventing a surge from traveling through an integrated circuit, the protection circuit itself may be damaged if an excessive surge instantaneously travels therethrough. This embodiment shows a structure for the protection circuit 320 to effectively function without being damaged, which is achieved by adding a capacitor for relieving the surge to the structure shown in Embodiment 1.

Figure 3A:
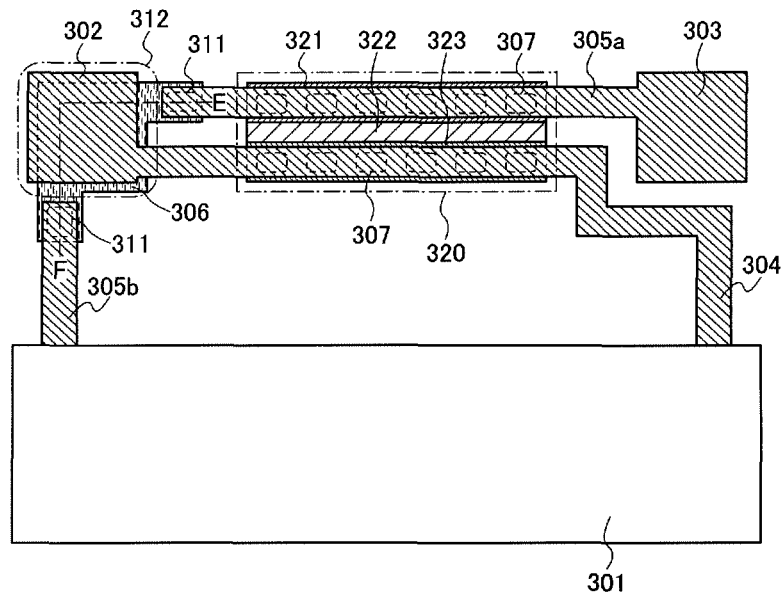
FIGS. 3A and 3B show a semiconductor device in an embodiment of the present invention.

FIG. 3A shows a plane structure of a semiconductor device in this embodiment. The wiring 305 for connecting the terminal electrode 303, the protection circuit 320, and the integrated circuit 301 is divided into the wiring 305a and the wiring 305b, and the wiring 305a and the wiring 305b are electrically connected to each other through the wiring 306 formed using another conductive layer.

Here, the wiring 306 is placed so as to overlap with the terminal electrode 302 to form a capacitor 312. The capacity of the capacitor 312 can have a predetermined value by adjusting an area where the wiring 306 and the terminal electrode 302 overlap with each other, and the dielectric constant and film thickness of an insulating film placed between the wiring 306 and the terminal electrode 302.

Figure 3B:
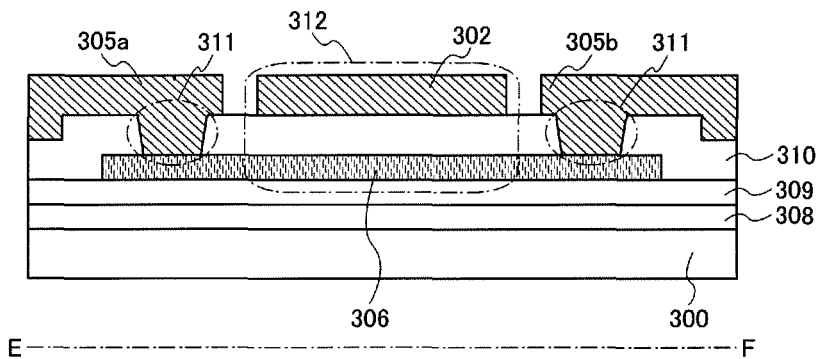

FIG. 3B shows a cross-sectional structure of a part along a line E-F in FIG. 3A. The wiring 305a and the wiring 305b are electrically connected to the wiring 306, which is formed using another conductive layer, through openings 311 provided in the insulating film 310. Further, the region where the wiring 306 and the terminal electrode 302 overlap with each other serves as the capacitor 312.

The capacitor 312 is electrically connected in parallel to the protection circuit 320. The capacitor 312 can relieve a surge travelling through the terminal electrodes and make the protection circuit 320 effectively function without damage to the protection circuit 320.

In this embodiment, an example in which the capacitor 312 is formed using the terminal electrode 302 is shown; it is also acceptable that a part of the terminal electrode 303 be provided with a capacitor as appropriate.

Next, calculation results of a voltage applied to the integrated circuit in the case where a surge travels through the semiconductor device in this embodiment are described with reference to FIG. 7 and FIG. 8.

Figure 7:
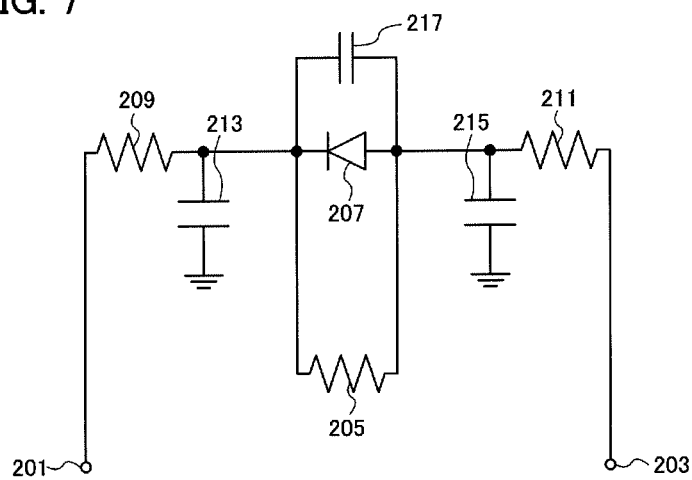
FIG. 7 shows an equivalent circuit diagram of a semiconductor device of an embodiment of the present invention.

FIG. 7 shows an equivalent circuit diagram of the semiconductor device in this embodiment.

In the equivalent circuit in FIG. 7, a capacitor 217 is connected between the parasitic capacitance 213 and the parasitic capacitance 215 and in parallel to the protection circuit 207 in addition to the equivalent circuit in FIG. 5B. The capacitor 217 corresponds to the capacitor 312 in FIG. 3A.

Figure 8:
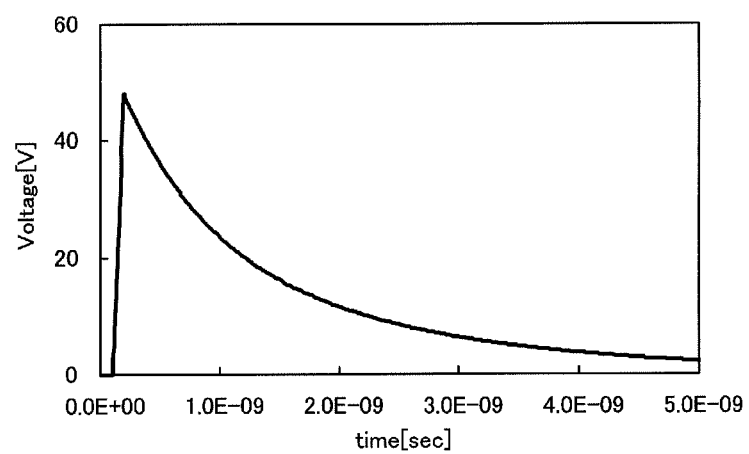
FIG. 8 shows circuit calculation results of a semiconductor device of an embodiment of the present invention.

Circuit calculation results of the semiconductor device in this embodiment are shown in FIG. 8. In a manner similar to Embodiment 1, the calculation was performed by using a Smart Spice circuit simulator by Silvaco, Inc, the terminal electrode 203 is grounded, and a voltage applied to the integrated circuit 205 in the case where a pulse of 1 kV is input to the terminal electrode 201 for 100 psec was calculated here. In FIG. 8, the horizontal axis denotes a time and the vertical axis denotes a voltage applied to the integrated circuit 205.

In the semiconductor device in this embodiment, the voltage applied to the integrated circuit 205 is found to be lower than that of the semiconductor device in Embodiment 1. This is because a voltage applied to the terminal electrode 201 is transmitted to the capacitor 217, which is connected in parallel to the protection circuit 207, as well as the parasitic resistance 209 and the parasitic capacitance 213 before being transmitted to the integrated circuit 205; thus, these parasitic resistance and parasitic capacitance produce time delay. As a result, a sudden increase in the voltage applied to the integrated circuit 205 is prevented, and the protection circuit 320 is made to effectively function without being damaged. In addition, although not illustrated, providing also the terminal electrode 303 with a capacitor is expected to further increase the effect of relieving a surge.

As described above, the capacitors can relieve a surge travelling through the terminal electrode and prevent the protection circuit from being damaged even when an excessive surge instantaneously travels therethrough. That is, the capacitors can prevent the protection circuit from being damaged and can effectively reduce the adverse effect of the surge on the integrated circuit.

Embodiment 3

Figure 9:
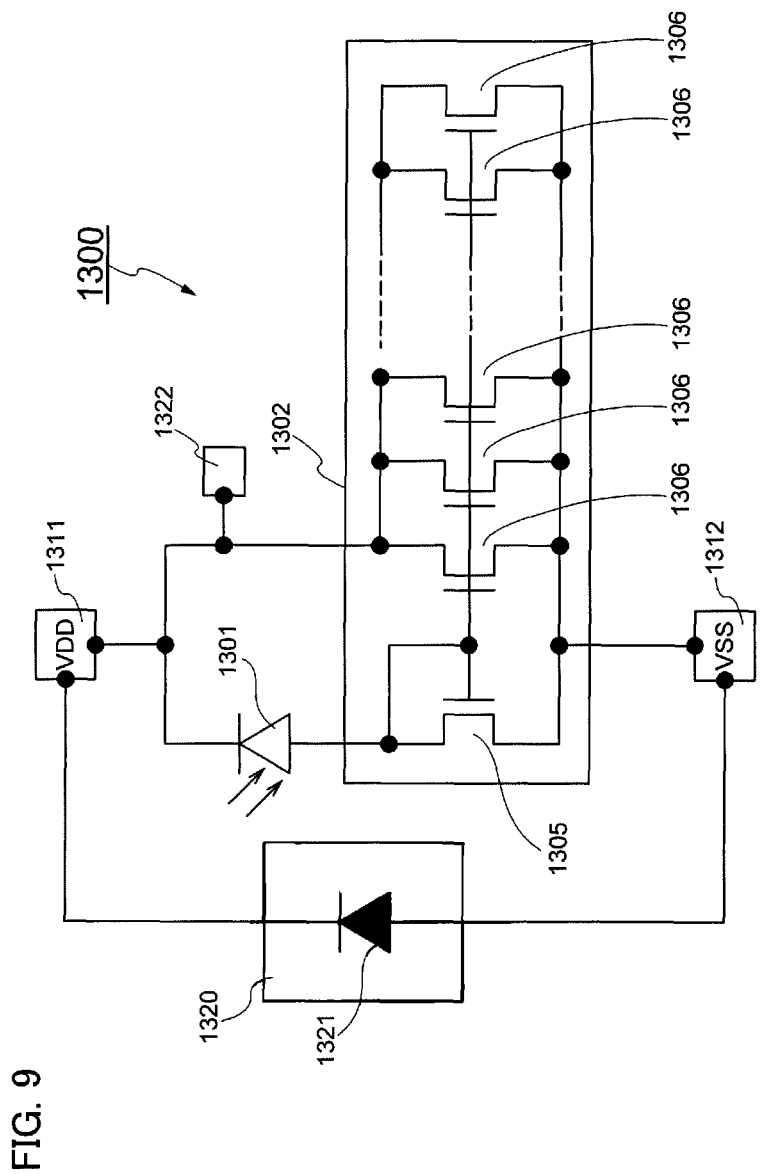
FIG. 9 is a circuit diagram showing a structure of a photodetector of an embodiment of the present invention.
Figure 10:
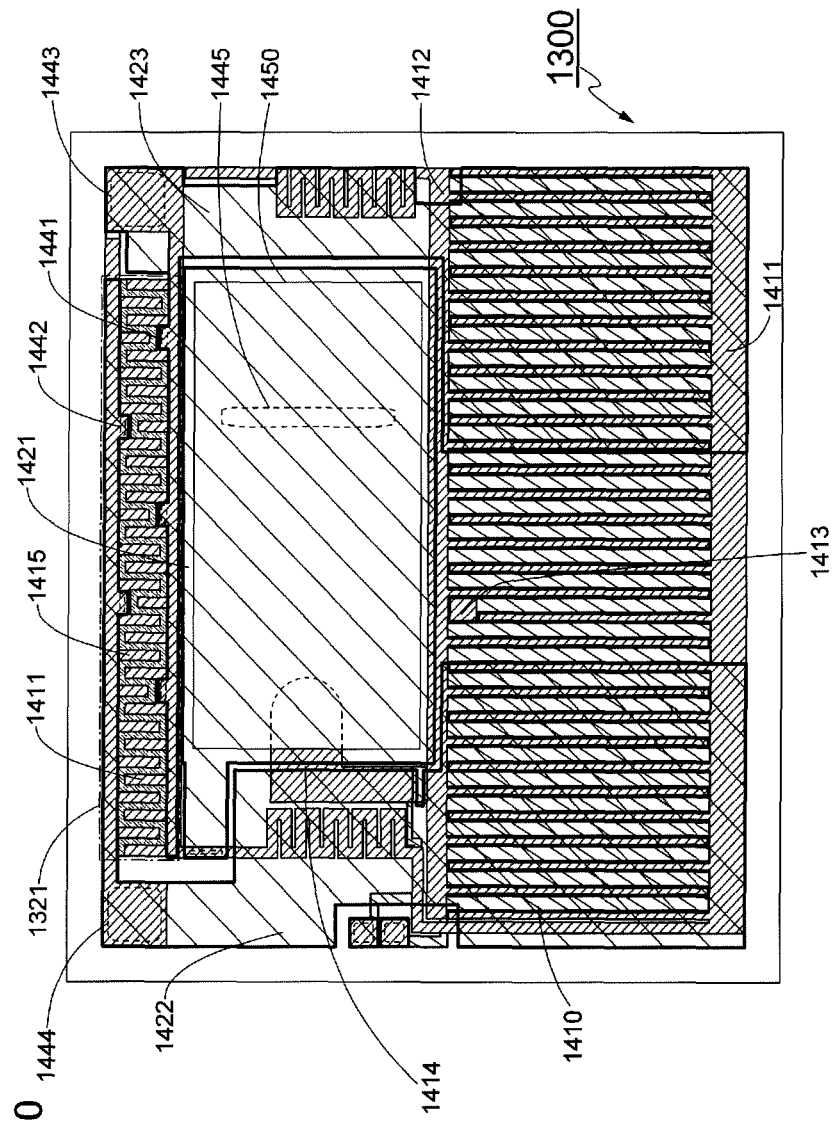
FIG. 10 is a plane view of the photodetector of an embodiment of the present invention.
Figure 11:
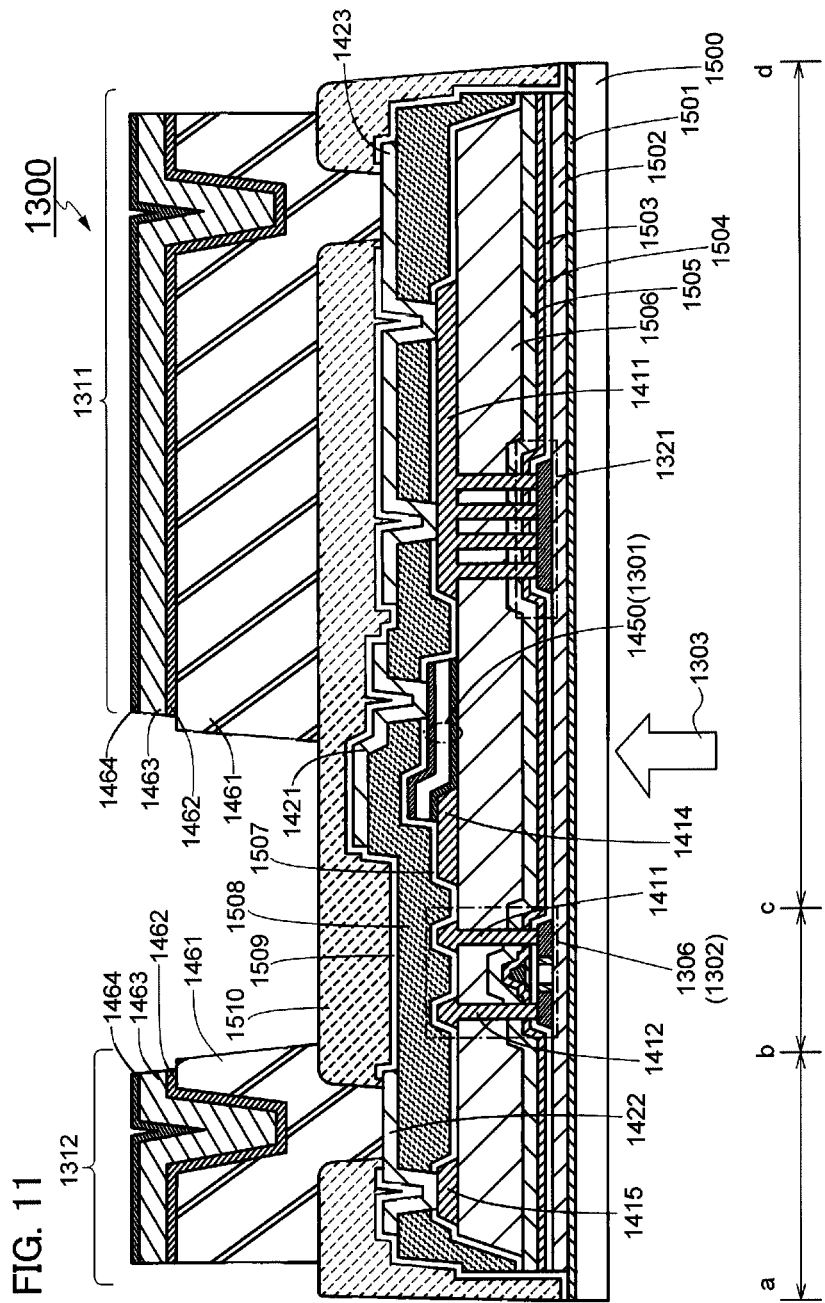
FIG. 11 is a cross-sectional view showing a multi-layer structure of the photodetector of an embodiment of the present invention.

In this embodiment, a photodetector is described as a specific example of a semiconductor device including a protection circuit. First, the structure of the photodetector is described with reference to FIG. 9, FIG. 10, and FIG. 11. FIG. 9 is a circuit diagram of a photodetector in this embodiment. FIG. 10 is a plane view showing the layout of the photodetector. FIG. 11 is a cross-sectional view showing a multi-layer structure of the photodetector.

As shown in FIG. 9, a photodetector 1300 in this embodiment includes a photodiode 1301, an amplifier circuit 1302, a power supply terminal 1311 to which a high power supply potential VDD is applied, a power supply terminal 1312 to which a low power supply potential VSS is applied, and a protection circuit 1320. In the photodetector 1300, a potential of the power supply terminal 1312 can be a ground potential GND.

The photodiode 1301 is a photoelectric conversion element that converts received light into electrical signals. A photo transistor may be provided instead of the photodiode 1301, as the photoelectric conversion element. The amplifier circuit 1302 is a circuit for amplifying the output of the photodiode 1301. Here, the amplifier circuit 1302 is formed using a current mirror circuit. The current mirror circuit includes one transistor 1305, and a plurality of transistors 1306 connected in parallel to each other. The amplification factor of a current flowing to the transistor 1305 can be adjusted in accordance with the number of the transistors 1306. For example, in order to amplify the output of the photodiode 1301 by a factor of 100, ninety-nine transistors 1306 are connected in parallel for one transistor 1305.

In this embodiment, the transistor 1305 and the transistor 1306 in the amplifier circuit 1302 are both n-channel transistors. Each of sources of the transistor 1305 and the plurality of transistors 1306 is electrically connected to the power supply terminal 1312. A drain of the transistor 1305 is electrically connected to a gate of the transistor 1305 and an anode of the photodiode 1301. Each of drains of the plurality of transistors 1306 is electrically connected to the power supply terminal 1311. Each of gates of the plurality of transistors 1306 is electrically connected to the gate of the transistor 1305. Note that the transistor 1305 and the transistors 1306 can be both p-channel transistors instead.

In addition, instead of the amplifier circuit 1302, an attenuation circuit for attenuating the output of the photodiode 1301 may be provided. The attenuation circuit can be formed using a current-mirror circuit. In such a current-mirror circuit, the number of transistors 1305 is preferably larger than that of transistors 1306. For example, in order to attenuate the output of the photodiode 1301 by a factor of 100, one transistor 1306 may be provided for 100 parallel-connected transistors 1305. Note that for the function of the attenuation circuit, a terminal 1322 may be provided to extract the output therefrom.

The protection circuit 1320 includes a diode 1321. The diode 1321 is provided between the power supply terminal 1311 and the power supply terminal 1312, a cathode of the diode 1321 is electrically connected to the power supply terminal 1311, and an anode of the diode 1321 is electrically connected to the power supply terminal 1312. In the case where an overvoltage (a surge) is applied to the power supply terminal 1311 and/or the power supply terminal 1312 because of ESD or the like, the power supply terminal 1311 and the power supply terminal 1312 are short-circuited by the diode 1321, so that overvoltage can be prevented from being applied to the amplifier circuit 1302 and the photodiode 1301.

Next, the plane layout of the photodetector 1300 in this embodiment is described with reference to FIG. 10. FIG. 10 shows a semiconductor film used for forming the transistors 1305 and 1306 included in the amplifier circuit 1302 shown in FIG. 9, a semiconductor film (a photoelectric conversion layer) used for forming the photodiode 1301, a semiconductor film used for forming the diode 1321, and conductive films for first to third layers of the photodetector 1300. The photodetector 1300 further includes a conductive film for a fourth layer used for forming the power supply terminal 1311 and the power supply terminal 1312.

A conductive film 1410 is a conductive film for the first layer. The conductive film 1410 is used for forming gate wirings (gate electrodes) of the transistors 1305 and 1306 used for forming the amplifier circuit 1302. Below the conductive film 1410, one semiconductor film included in the transistors 1305 and 1306 is formed with an insulating film therebetween. The semiconductor film used for forming the diode 1321 is formed in the same layer as this semiconductor film.

Conductive films for the second layer are formed over the conductive film 1410 with an insulating film therebetween. Here, four conductive films 1411 to 1415 are formed as conductive films for the second layer. The conductive film 1411 is used for forming a drain wiring of the transistor 1306 and the cathode of the diode 1321. The conductive film 1412 is used for forming a source wiring of each of the transistor 1305 and the transistor 1306. The conductive film 1413 is used for forming a drain electrode of the transistor 1305. With the conductive film 1413, a gate electrode of the transistor 1305 is electrically connected to the drain electrode thereof. The conductive film 1414 is used for forming an electrode for electrically connecting the photodiode 1301 and the amplifier circuit 1302. Note that although not shown in the drawing, the conductive film 1412 and the conductive film 1415 are electrically connected to each other through a wiring electrode formed using the conductive film for the first layer.

In addition, the conductive film 1414 is electrically connected to the conductive film 1410 for the first layer through an opening formed in the insulating film. Thus, the gate electrodes (the gate wirings) of the transistors 1305 and 1306 are electrically connected to the anode of the photodiode 1301.

A photoelectric conversion layer 1450 is formed on and in contact with the conductive film 1414 for the second layer. The photoelectric conversion layer 1450 is used for forming the photodiode 1301.

An insulating film that covers the conductive films 1411 to 1415 for the second layer and the photoelectric conversion layer 1450 is formed, and over this insulating film, conductive films 1421 to 1423 are formed as the conductive films for the third layer. The conductive film 1421 is electrically connected to the photoelectric conversion layer 1450 through a single or plurality of openings 1445 formed in the insulating film. The conductive film 1422 is electrically connected to the conductive film 1415 through an opening 1444 and an opening 1442 which are formed in the insulating film. The conductive film 1423 is electrically connected to the conductive film 1411 through an opening 1441 and an opening 1443 which are formed in the insulating film.

The photodetector 1300 further includes a conductive film for the fourth layer. As shown in FIG. 11, the conductive film for the fourth layer is used for forming the power supply terminal 1311 and the power supply terminal 1312. In this embodiment, the power supply terminals 1311 and 1312 are each formed using a four-layer conductive film. The power supply terminal 1311 is electrically connected to the conductive film 1423, and the power supply terminal 1312 is electrically connected to the conductive film 1422.

Note that FIG. 11 is not a cross-sectional view taken along a particular section line in the plane view of FIG. 10 but a cross-sectional view for describing the multi-layer structure having films that are used for forming the photodetector 1300 and describing electrical connection between the conductive films formed in different layers. In FIG. 11, electrical a connection between the conductive films for the second layer and the third layer and the power supply terminal 1312 is mainly illustrated between in a section indicated by the line a-b. The transistor 1306 is typically illustrated in a section indicated by the line b-c for a cross section of the amplifier circuit 1302. Electrical a connection between the conductive films for the second layer and the third layer and the power supply terminal 1311 and cross-sectional structures of the photodiode 1301 and the diode 1321 are mainly illustrated in a section indicated by the line c-d.

In this embodiment, a glass substrate 1500 is used as a substrate over which the integrated circuit is formed. When light 1303 that has passed through the glass substrate 1500 enters the photodiode 1301, the photodiode 1301 converts the light into electrical signals. The electrical signals are amplified in the amplifier circuit 1302 and are output from the photodetector 1300 as a current that flows between the power supply terminal 1311 and the power supply terminal 1312. In this embodiment, a coloring layer (a color filter layer) for selectively transmitting light in a particular wavelength range can be formed over a surface, of the glass substrate 1500, on which the light 1303 is incident. For the coloring layer, a resin in which a pigment is dispersed or the like can be used, for example.

Next, a method for manufacturing the photodetector and a cross-sectional structure of the photodetector will be described. First, the method for manufacturing the transistors 1305 and 1306 and the diode 1321 will be described with reference to cross-sectional views of FIGS. 12A to 12E and FIGS. 13A to 13D and with reference to plane views of FIGS. 18A and 18B, FIGS. 19A and 19B, and FIG. 20.

First, the glass substrate 1500 is prepared. A non-alkali glass substrate is preferably used as the glass substrate 1500. Examples of the non-alkali glass substrate include an aluminosilicate glass substrate, an aluminoborosilicate glass substrate, a barium borosilicate glass substrate, and the like. A quartz substrate can be used instead of the glass substrate 1500.

Figure 12A:
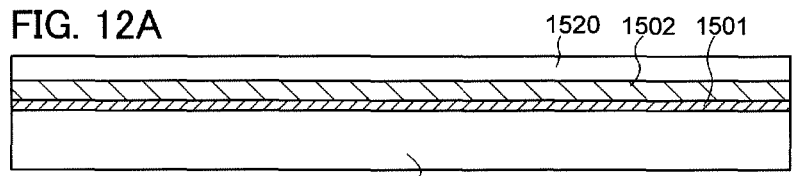
FIGS. 12A to 12E are cross-sectional views showing a manufacturing method of a semiconductor device of an embodiment of the present invention.

Next, a base insulating film with a thickness of 50 to 1300 nm is formed over the glass substrate 1500. Here, as shown in FIG. 12A, a two-layer insulating film having a silicon nitride oxide film 1501 and a silicon oxynitride film 1502 is formed as the base insulating film. Next, a semiconductor film with a thickness of 20 nm to 100 nm is formed over the base insulating film to be each semiconductor film used for forming the diode 1321 and the transistors 1305 and 1306.

The base insulating film is provided in order to prevent diffusion of an alkali metal (typically, Na) and alkaline earth metal contained in the glass substrate 1500 from adversely affecting electric characteristics of a semiconductor element such as a transistor. The base insulating film may have a single or multi-layer structure having at least one layer that serves as a barrier film for preventing diffusion of an alkali metal or an alkali earth metal. In this embodiment, the silicon nitride oxide film 1501 is provided as a barrier film. A nitride oxide film such as a silicon nitride oxide film or a nitride film such as a silicon nitride film or an aluminum nitride film is suitable for a barrier film. In order to decrease the interface state density between the semiconductor film and the base insulating film which are included in the transistors 1305 and 1306, the silicon oxynitride film 1502 is formed.

In this embodiment, the 140-nm-thick silicon nitride oxide film 1501, the 100-nm-thick silicon oxynitride film 1502, and a 50-nm-thick amorphous silicon film 1520 are successively formed by one PECVD apparatus. Source gases for the silicon nitride oxide film 1501 are $SiH_4$, $N_2O$, $NH_3$, and $H_2$. Source gases for the silicon oxynitride film 1502 are $SiH_4$ and $N_2O$. Source gases for the amorphous silicon film 1520 are $SiH_4$ and $H_2$. By changing the source gases, three kinds of films can be successively formed in one chamber.

In this embodiment, the transistors 1305 and 1306 and the diode 1321 are formed using a crystalline semiconductor film. Therefore, the amorphous semiconductor film is crystallized to form a crystalline semiconductor film. As the method for crystallizing the semiconductor film, a solid-phase growth method using a lamp-annealing apparatus or a furnace, a laser-crystallization method in which a semiconductor film is melted and crystallized by laser-light irradiation, or the like can be used.

Figure 12B:
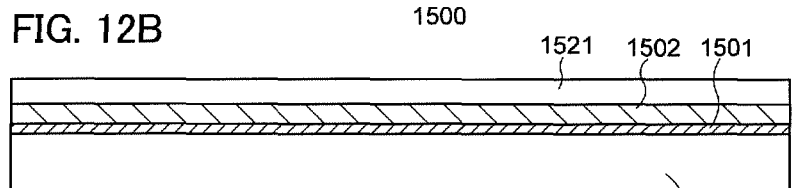

Here, the amorphous silicon film 1520 is formed over the base insulating film and subjected to solid phase growth to be crystallized, so that a crystalline silicon film 1521 is formed (see FIGS. 12A and 12B). Here, in order to perform the solid phase growth at a heating temperature of 600° C. or less for a short time, a metal element is added to the amorphous silicon film 1520. The crystallization method of the amorphous silicon film 1520 will be described in detail below.

First, the surface of the amorphous silicon film 1520 is subjected to ozone water treatment to form a very-thin (several-nanometer-thick) oxide film, so that the wettability of the surface of the amorphous silicon film 1520 is improved. Next, the surface of the amorphous silicon film 1520 is coated with a nickel acetate solution containing nickel at a weight of 10 ppm, by a spinner.

Next, the amorphous silicon film 1520 is heated in a furnace, thereby forming the crystalline silicon film 1521. For example, in order to crystallize the amorphous silicon film 1520, the amorphous silicon film 1520 may be heated at 500° C. for 1 hour, for example, and then, may be heated at 550° C. for 4 hours. The catalytic action of nickel allows the crystalline silicon film 1521 to be formed at a low temperature in a short time. Further, with the catalytic action of nickel, the crystalline silicon film 1521 having fewer dangling bonds at crystal grain boundaries can be formed. Examples of a metal element which promotes the crystallization of silicon include Fe, Co, Ru, Rh, Pd, Os, Ir, and Pt in addition to Ni.

As a method for introducing such a metal element into the amorphous silicon film 1520, a method by which a film containing a metal element as its main component is formed on the surface of the amorphous silicon film 1520, a method by which a metal element is added to the amorphous silicon film 1520 by plasma doping, or the like can be used instead of the method by which the amorphous silicon film 1520 is coated with a solution of such a metal element.

Next, in order to reduce the crystal defects in the crystalline silicon film 1521 and in order to improve the degree of crystallization, the crystalline silicon film 1521 is irradiated with laser light. Here, the crystalline silicon film 1521 is irradiated with excimer laser light (XeCl: a wavelength of 308 nm). A beam with a wavelength of 400 nm or less is preferably used as the laser light. Examples of such laser light include excimer laser light such as XeCl excimer laser light, the second harmonic or the third harmonic of a YAG laser. Before the laser light irradiation, an oxide film formed on a surface of the crystalline silicon film 1521 is preferably removed using dilute hydrofluoric acid or the like.

In this embodiment, treatment for gettering of nickel introduced for crystallization from the crystalline silicon film 1521 is performed. Nickel is useful for the crystallization of the amorphous silicon film 1520; however, if nickel is contained in the crystalline silicon film 1521 at high concentration, nickel might be a factor of degradation of the electric characteristics of the transistors 1305 and 1306, for example, the increase in the leakage current of the transistors 1305 and 1306. An example of the gettering treatment will be described below.

First, the surface of the crystalline silicon film 1521 is cleaned with ozone water for about 120 seconds so that an oxide film having a thickness of approximately 1 to 10 nm may be formed on the surface of the crystalline silicon film 1521. Instead of the surface treatment with ozone water, UV light irradiation may be performed. Next, an amorphous silicon film containing Ar is formed to a thickness of approximately 10 to 400 nm on the surface of the crystalline silicon film 1521 with the oxide film therebetween. It is preferable that the Ar concentration in this amorphous silicon film be $1 \times 10^{18}$ atoms/cm$^3$ to $1 \times 10^{22}$ atoms/cm$^3$. In addition, instead of Ar, another Group 18 element of the periodic table may be added into the amorphous silicon film.

The addition of the Group 18 element of the periodic table into the amorphous silicon film is performed for the purpose of distorting the amorphous silicon film to form gettering sites in the amorphous silicon film. There are two factors that cause the distortion when the Group 18 element is added. One is the formation of dangling bonds in crystals due to addition of the Group 18 element, and the other is the addition of the Group 18 element between crystal lattices.

For example, in order to form the amorphous silicon film containing Ar (hereinafter referred to as an Ar:a-Si film) by PECVD, $SiH_4$, $H_2$, and Ar are preferably used as source gases. It is preferable that the flow ratio of $SiH_4$ to Ar, $SiH_4$/Ar, be 1/999 to 1/9. Further, process temperature is preferably 500° C. to 1300° C. RF power density for excitation of the source gases is preferably 0.0017 W/cm$^2$ to 0.48 W/cm$^2$. Process pressure is preferably 1.333 Pa to 66.65 Pa.

For example, in the case of forming the Ar:a-Si film by a sputtering method, single crystal silicon should be used as a target and Ar may be used as a gas for sputtering. By glow discharge of the Ar gas and sputtering of the single-crystal-silicon target with Ar ions, the amorphous silicon film containing Ar can be formed. The Ar concentration in the amorphous silicon film can be controlled by power, pressure, temperature, or the like for the grow discharge. Process pressure should be 0.1 Pa to 5 Pa. The lower the pressure, the higher Ar concentration in the amorphous silicon film; the pressure is preferably 1.5 Pa or less. The glass substrate 1500 is not necessarily heated in the process; the process temperature is preferably 1300° C. or less.

After the Ar:a-Si film is formed, heat treatment at 650° C. for 3 minutes is performed in a furnace for gettering. With this heat treatment, Ni is precipitated out of the crystalline silicon film 1521 onto the Ar:a-Si film and then is captured. As a result, the concentration of Ni in the crystalline silicon film 1521 can be lowered. After the heat treatment is completed, the Ar:a-Si film is removed by etching. In this etching, the oxide film serves as an etching stopper. After the removal of the Ar:a-Si film, the oxide film on the surface of the crystalline silicon film 1521 is removed by dilute fluorine acid or the like. Thus, the crystalline silicon film 1521 with the reduced concentration of Ni is formed.

Next, an acceptor element is added into the crystalline silicon film 1521. This is because the threshold voltages of the transistors 1305 and 1306 are controlled. For example, boron is used as the acceptor element and added into the crystalline silicon film 1521 such that boron is contained at a concentration of $1\times10^{16}$ to $5\times10^{17}$ atoms/cm$^3$.

Figure 12C:
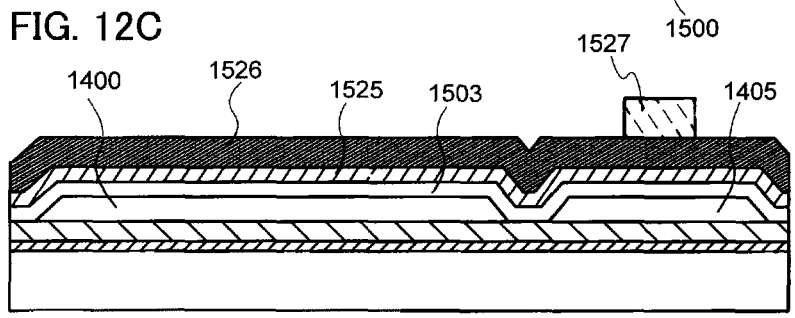
Figure 18A:
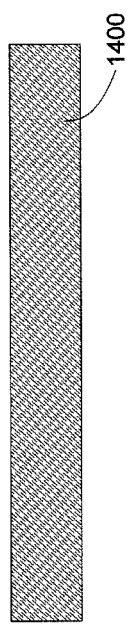
FIGS. 18A and 18B are plane views showing the manufacturing method of the semiconductor device of an embodiment of the present invention.
Figure 18B:
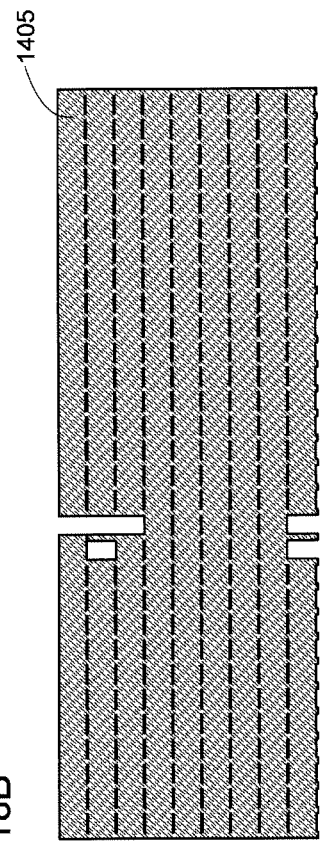

A resist mask is subsequently formed over the crystalline silicon film 1521, and the crystalline silicon film 1521 is etched using the resist mask so that a semiconductor film 1400 used for forming the diode 1321 and a semiconductor film 1405 used for forming the amplifier circuit 1302 may be formed in island shapes, as shown in FIG. 12C. FIG. 18A shows the plane layout of the semiconductor film 1400 and FIG. 18B shows the plane layout of the semiconductor film 1405.

The semiconductor film 1400 and the semiconductor film 1405 are formed using a silicon film in this embodiment; they can be formed using an alternative semiconductor film formed using germanium, silicon germanium, silicon carbide, or the like. In addition, a compound semiconductor film formed using any of GaAs, InP, SiC, ZnSe, GaN, and SiGe, or an oxide semiconductor film formed using zinc oxide (ZnO), gallium-added zinc oxide (GZO), tin oxide (SnO), or the like can alternatively be used.

Next, a gate insulating film is formed over the semiconductor film 1400 and the semiconductor film 1405 as shown in FIG. 12C. Here, as the gate insulating film, a 30-nm-thick silicon oxynitride film 1503 is formed. The silicon oxynitride film 1503 is formed using $SiH_4$ and $N_2O$ as source gases by PECVD.

Then, as a conductive film used for forming a conductive film 1410, a two-layer conductive film having a 30-nm-thick tantalum nitride film 1525 and a 170-nm-thick tungsten film 1526 is formed over the gate insulating film. The tantalum nitride film 1525 and the tungsten film 1526 are formed by a sputtering method. Instead of the multi-layer film having the tantalum nitride film 1525 and the tungsten film 1526, for example, a multi-layer film having a tungsten nitride film and a tungsten film, or a multi-layer film having a molybdenum nitride film and a molybdenum film can be formed. In this embodiment, since a source region, a drain region, and a low-concentration impurity region are formed in the semiconductor film 1405 in a self-aligned manner by using the conductive film 1410 as a mask for addition of an impurity, the conductive film in the upper layer is made smaller than the conductive film in the lower layer when viewed from above. In order to facilitate the formation of the conductive film 1410, the etching rate of the conductive film in the lower layer is preferably low compared to that of the conductive film in the upper layer. In this respect, the multi-layer film having the tantalum nitride film 1525 and the tungsten film 1526 is preferable.

Figure 12D:
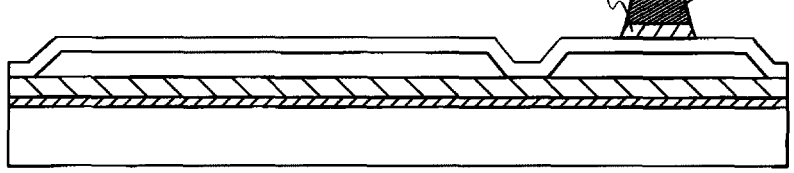

Next, a resist mask 1527 is formed over the tungsten film 1526. Etching treatment is performed twice using this resist mask 1527. First, as shown in FIG. 12D, the tantalum nitride film 1525 and the tungsten film 1526 are etched using the resist mask 1527. With this first etching, cross sections of the multi-layer film having the tantalum nitride film 1525 and the tungsten film 1526 are tapered. This etching treatment can be performed, for example, using a mixed gas of $CF_4$, $Cl_2$, and $O_2$ as an etching gas with an ICP (inductively coupled plasma) etching apparatus.

Figure 12E:
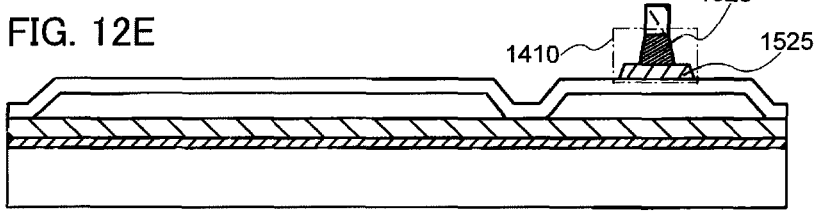

Furthermore, the tungsten film 1526 in the upper layer is selectively etched using the resist mask 1527 as shown in FIG. 12E. This etching treatment is an anisotropic etching and can be performed, for example, using a mixed gas of $Cl_2$, $SF_6$, and $O_2$ as an etching gas with an ICP etching apparatus. By the etching treatment which is performed twice, the first conductive film 1410 is formed. In the conductive film 1410, the end portion of the tungsten film 1526 is over the tantalum nitride film 1525, and the tungsten film 1526 is smaller than the tantalum nitride film 1525 when viewed from above. FIG. 19B shows the plane layout of the semiconductor film 1405 and the conductive film 1410.

After the resist mask 1527 is removed, a resist mask 1528 is formed so as to cover regions serving as a high-resistance region and a p-type impurity region in the semiconductor film 1400, as shown in FIG. 13A. Then, a donor element is added to the semiconductor film 1400 and the semiconductor film 1405 so that an n-type impurity region is formed. Here, phosphorus is added as the donor element. First, in order to form an n-type low-concentration impurity region in the semiconductor film 1405, phosphorus is added into the semiconductor film 1400 and the semiconductor film 1405 under the condition in which the dosage is low and the acceleration voltage is high. As a source gas for phosphorus, $PH_3$ can be used. Under this condition, only a portion, of the conductive film 1410, in which the tantalum nitride film 1525 and the tungsten film 1526 are layered functions as a mask, so that phosphorus passes through a portion, of the conductive film 1410, in which only the tantalum nitride film 1525 is formed, forming a low-concentration impurity region 1530 in the semiconductor film 1405. Further, a low-concentration impurity region 1531 is formed in the semiconductor film 1400.

Next, in order to form source regions and drain regions of the transistors 1305 and 1306 and an n-type impurity region of the diode 1321, phosphorus is added under the condition in which the dosage is high and the acceleration voltage is low. Under this condition, the entire conductive film 1410 serves as a mask, and n-type high-concentration impurity regions 1406, n-type low-concentration impurity regions 1407, and a channel formation region 1408 are formed in the semiconductor film 1405 in a self-aligned manner, as shown in FIG. 13B. Further, an n-type impurity region 1401 which is used for a PIN junction is formed in the semiconductor film 1400.

After the resist mask 1528 is removed, a resist mask 1529 is formed so as to cover the entire semiconductor film 1405 and regions which serve as the high resistivity regions and an n-type impurity region in the semiconductor film 1400, as shown in FIG. 13C. Next, an acceptor element is added into the semiconductor film 1400 to form a p-type impurity region. Here, boron is added as the acceptor element. As a source gas for boron, $B_2H_6$ can be used. Further, a region where the donor element and the acceptor element are not added in the steps of adding impurity elements described with reference to FIGS. 13A to 13C serves as a high resistivity region 1403. FIG. 19A is a plane view of the diode 1321.

In this embodiment, a border between the n-type impurity region 1401 and the p-type impurity region 1402 forms a comb shape (projections and depressions) in a plane view. Thus, the length of the border, which is in the diode 1321, can be greater than the length of the long side of the semiconductor film 1400.

FIG. 19A shows openings 1431 through which the n-type impurity region 1401 and the conductive film 1411 are connected to each other and openings 1432 through which the p-type impurity region 1402 and the conductive film 1411 are connected to each other.

After the resist mask 1529 is removed, an interlayer insulating film for a first layer is formed over the glass substrate 1500 so as to cover the conductive film 1410, as shown in FIG. 13D. In this embodiment, the interlayer insulating film has a three-layer structure. The first layer is a 30-nm-thick silicon oxynitride film 1504, the second layer is a 165-nm-thick silicon nitride oxide film 1505, and the third layer is a 600-nm-thick silicon oxynitride film 1506. These films are formed with a PECVD apparatus.

First, the silicon oxynitride film 1504 is formed using $SiH_4$ and $N_2O$ as a source gases. Then, heat treatment is performed to activate phosphorus and boron added into the semiconductor film 1400 and the semiconductor film 1405. Here, heat treatment is performed at 480° C. for 1 hour. After this heat treatment is completed, the silicon nitride oxide film 1505 and the silicon oxynitride film 1506 are formed with a PECVD apparatus. As source gases for the silicon nitride oxide film 1505, $SiH_4$, $N_2O$, $NH_3$, and $H_2$ are used so as to increase the hydrogen concentration of the silicon nitride oxide film 1505. $SiH_4$ and $N_2O$ are used as source gases for the silicon oxynitride film 1506. After the silicon oxynitride film 1506 is formed, heat treatment is performed to diffuse hydrogen contained in the silicon nitride oxide film 1505, so that uncoupled bonds of the semiconductor film 1400 and the semiconductor film 1405 are terminated with hydrogen. This heat treatment can be performed at a temperature of 500° C. to 1300° C.

The subsequent steps are described with reference to the cross-sectional views in FIGS. 14A to 14C, FIGS. 15A and 15B, FIGS. 16A and 16B, and FIG. 17, and a plane view of FIG. 21. Here, method for depicting FIGS. 14A to 14C, FIGS. 15A and 15B, FIGS. 16A and 16B, and FIG. 17 is similar to that of FIG. 11.

A multi-layer film having the silicon oxynitride film 1503, the silicon oxynitride film 1504, the silicon nitride oxide film 1505, and the silicon oxynitride film 1506 is etched using a resist mask, forming openings serving as contact holes. Portions forming the openings are a connection portion between the conductive film 1411 and the n-type impurity region 1401 in the semiconductor film 1400, a connection portion between the conductive film 1415 and the p-type impurity region 1402 in the semiconductor film 1400, a connection portion between the conductive film 1411 and the n-type high-concentration impurity region 1406 in the semiconductor film 1405, a connection portion between the conductive film 1412 and the n-type high-concentration impurity region 1406 of the semiconductor film 1405, a connection portion between the conductive film 1413 and the conductive film 1410, and a connection portion between the conductive film 1414 and the conductive film 1410.

The plurality of openings 1431 are formed in the n-type impurity region 1401 so that the n-type impurity region 1401 is electrically connected to the conductive film 1411, and the plurality of openings 1432 are formed in the p-type impurity region 1402 so that the p-type impurity region 1402 is electrically connected to the conductive film 1412 (see FIG. 19A). As described above, by forming the plurality of openings 1431 and 1432, contact resistance between the n-type impurity region 1401 and the conductive film 1411, and contact resistance between the p-type impurity region 1402 and the conductive film 1412 can be reduced.

Figure 20:
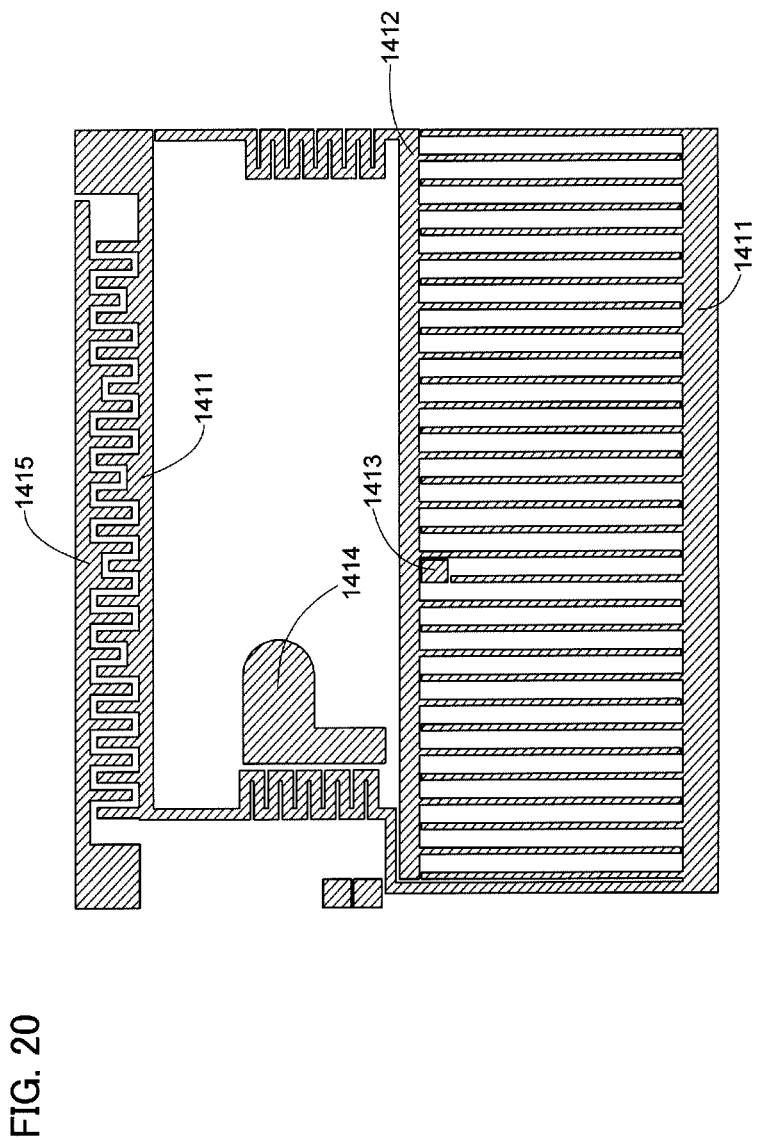
FIG. 20 is a plane view showing the manufacturing method of the semiconductor device of an embodiment of the present invention.

Next, a conductive film used for forming the conductive films 1411 to 1415 for the second layer is formed over the silicon oxynitride film 1506. Here, a 400-nm-thick titanium film is formed by a sputtering method. A resist mask is formed over this titanium film with which the titanium film is etched to form the conductive films 1411 to 1415 (see FIG. 14A). FIG. 20 shows a plane view of the conductive films 1411 to 1415 for the second layer.

Note that the conductive films 1411 to 1415 for the second layer and conductive films 1421 to 1423 for the third layer are preferably each formed using titanium, a titanium alloy, a titanium compound, molybdenum, a molybdenum alloy, or a molybdenum compound. This is because a film made from such a conductive material has the advantage in having high heat resistance, being impervious to galvanic corrosion due to a contact with a silicon film, and having low possibility of migration, for example.

Next, the photoelectric conversion layer 1450 used for forming the photodiode 1301 is formed over the silicon oxynitride film 1506 as shown in FIG. 14A. Here, an amorphous silicon film is formed as the photoelectric conversion layer 1450 with a PECVD apparatus. Further, in order to provide a PIN junction in the photoelectric conversion layer 1450, the photoelectric conversion layer 1450 has a three-layer structure that has a layer having p-type conductivity, a layer having i-type conductivity, and a layer having n-type conductivity. The photoelectric conversion layer 1450 is not limited to an amorphous silicon film, that is, the photoelectric conversion layer 1450 may be a microcrystalline silicon film or a single crystal silicon film, for example.

First, a 60-nm-thick p-type amorphous silicon film 1451, a 400-nm-thick i-type amorphous silicon film 1452, and an 80-nm-thick n-type amorphous silicon film 1453 are successively formed with a PECVD apparatus so as to cover the conductive films 1411 to 1415. Boron is added using $SiH_4$, $H_2$, and $B_2H_6$ as a source gas for the p-type amorphous silicon film 1451. Further, as a source gas for the i-type amorphous silicon film 1452, $SiH_4$ and $H_2$ are used, so that an amorphous silicon film in which impurity elements which serve as donors or acceptors are not added intentionally is formed. Phosphorus is added by using $SiH_4$, $H_2$, and $PH_3$ as a source gas for the n-type amorphous silicon film 1453. Subsequently, the multi-layer film having the amorphous silicon films 1451 to 1453 is etched using a resist mask so that the photoelectric conversion layer 1450 may be formed (see FIG. 14A).

Here, the plurality of photodetectors 1300 is concurrently formed over one glass substrate 1500. After the photodetectors 1300 are completed, the glass substrate 1500 is cut in accordance with the size of the photodetectors 1300 and is divided into individual devices. Here, in order to passivate the sides of the photodetector 1300 in a favorable way after being divided, the silicon oxynitride film 1506 in a periphery 1541 (indicated by a dotted line) of the photodetector 1300 is removed as shown in FIG. 14B. This step can be performed by etching treatment.

Next, an interlayer insulating film for a second layer is formed so as to cover the silicon nitride oxide film 1505, the silicon oxynitride film 1506, the conductive films 1411 to 1415, and the photoelectric conversion layer 1450. Here, a two-layer insulating film formed using a 100-nm-thick silicon nitride oxide film 1507 and an 800-nm-thick silicon oxide film 1508 is formed as shown in FIG. 14C.

The silicon nitride oxide film 1507 is formed with a PECVD apparatus by using $SiH_4$, $N_2O$, $NH_3$, and $H_2$ as source gases. The silicon nitride oxide film 1507 functions as a passivation film. Instead of the silicon nitride oxide film 1507, a silicon nitride film may be formed. The silicon nitride film can be formed using $SiH_4$, $NH_3$, and $H_2$ as source gases with a PECVD apparatus. The silicon oxide film 1508 is formed using $O_2$ and tetra-ethoxy-silane (abbreviation: TEOS, chemical formula: $Si(OC_2H_5)_4$) as source gases with a PECVD apparatus. Instead of the silicon oxide film 1508, a silicon oxynitride film may be formed with a PECVD apparatus.

Next, the multi-layer film formed using the silicon nitride oxide film 1507 and the silicon oxide film 1508 is etched using a resist mask so that the openings 1441 to 1445 may be formed (see FIG. 10). Each opening may be provided in one place or may be divided and provided in a plurality of places.

The openings 1441 are openings forming a connection portion in which the conductive film 1411 and the conductive film 1423 are connected to each other and are dispersively formed with respect to the n-type impurity region 1401 in the diode 1321 (see FIG. 10 and FIG. 15A). The openings 1442 are openings forming a connection portion in which the conductive film 1415 and the conductive film 1422 are connected to each other and are dispersively formed with respect to the p-type impurity region 1402 in the diode 1321. The openings 1443 and the openings 1444 are openings forming a connection portion in which the internal wirings of the amplifier circuit 1302 (the conductive film 1411 and the conductive film 1415) are electrically connected to the conductive films 1422 and 1423, respectively. The openings 1445 are openings forming a connection portion in which the photoelectric conversion layer 1450 and the conductive film 1421 are electrically connected to each other.

Then, the conductive films 1421 to 1423 for the third layer are formed over the silicon oxide film 1508. Here, a 200-nm-thick titanium film is formed by a sputtering method. A resist mask is formed over the titanium film and is used for etching the titanium film so that the conductive films 1421 to 1423 may be formed (see FIG. 15A).

Next, as shown in FIG. 15B, the insulating films 1502 to 1508 are removed from a periphery 1542 (indicated by a dotted line) of the photodetector 1300 so that the silicon nitride oxide film 1501 remains This step can be performed by etching treatment. The insulating films are removed from the periphery of the integrated circuit as described above in order to appropriately passivate the sides of the photodetectors 1300 after the glass substrate 1500 is divided, in a manner similar to the step described with reference to FIG. 14B in which the silicon oxynitride film 1506 is removed.

Figures 16A, 16B:
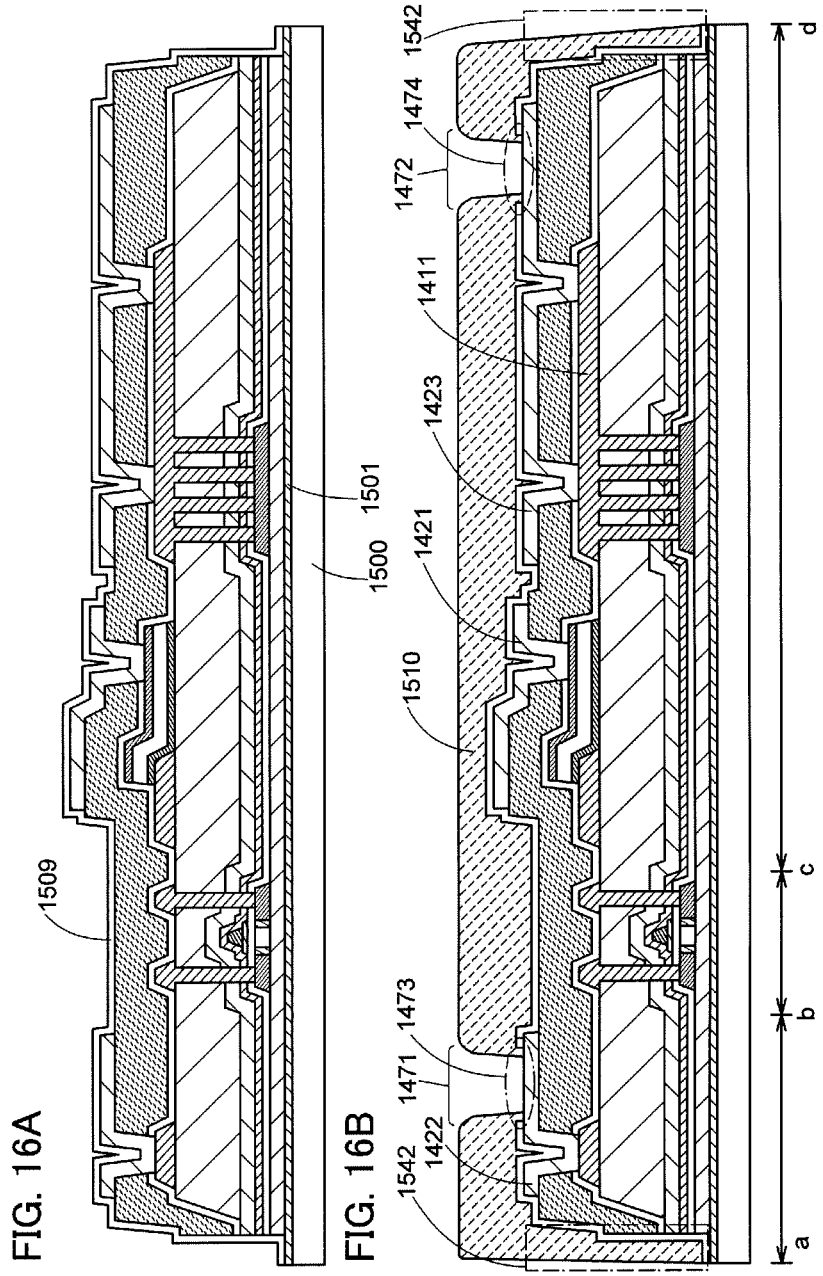
FIGS. 16A and 16B are cross-sectional views showing the manufacturing method of the semiconductor device of an embodiment of the present invention.
Figure 17:
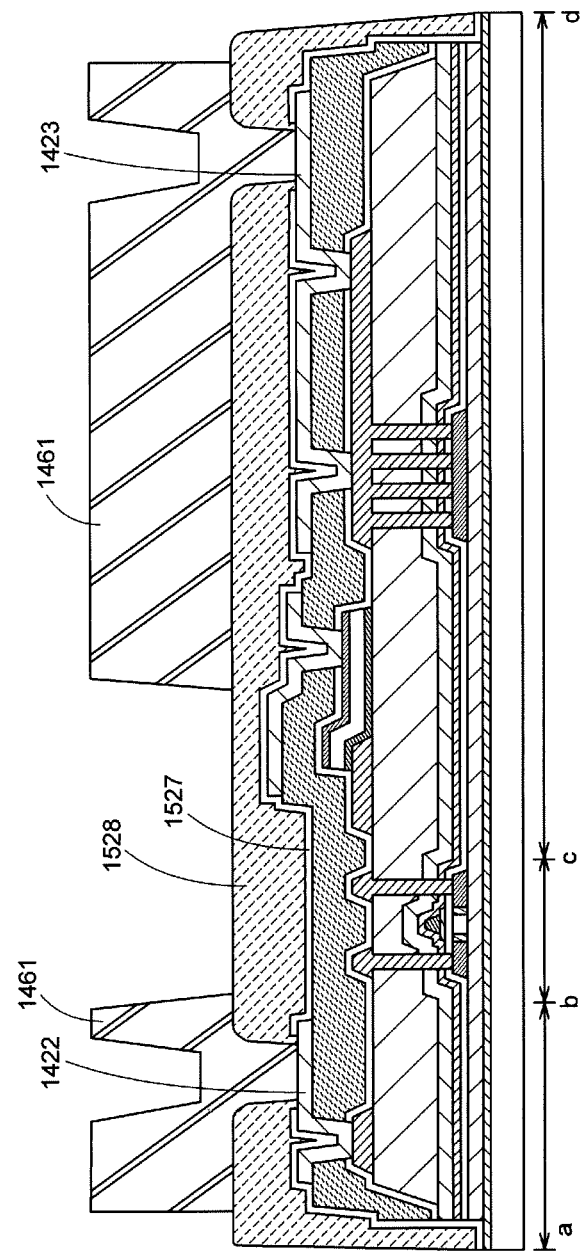
FIG. 17 is a cross-sectional view showing the manufacturing method of the semiconductor device of an embodiment of the present invention.

Next, a 100-nm-thick silicon nitride oxide film 1509 is formed as shown in FIG. 16A. The silicon nitride oxide film 1509 is formed with a PECVD apparatus using $SiH_4$, $N_2O$, $NH_3$, and $H_2$ as source gases. The silicon nitride oxide film 1509 functions as a passivation film. The exposed surfaces of the conductive films 1421 to 1423 for the third layer and all the insulating films 1501 to 1508 are covered with the silicon nitride oxide film 1509. Therefore, in the photodetector 1300 including the amplifier circuit 1302, the photodiode 1301, and the protection circuit 1320, the glass substrate 1500 side is passivated by the silicon nitride oxide film 1501 which serves as a barrier layer, and the side where the power supply terminal 1311 and the power supply terminal 1312 are formed is passivated by the silicon nitride oxide film 1509. This structure can prevent impurities such as moisture or organic substances from entering the photodetector 1300.

Figure 21:
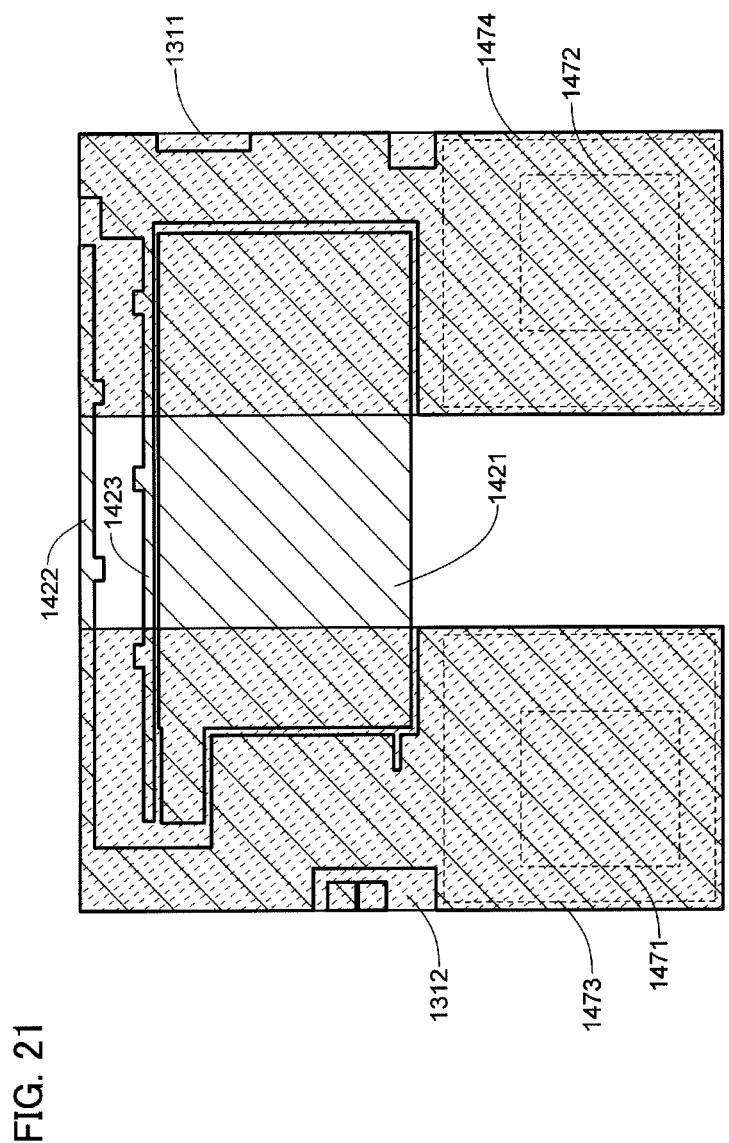
FIG. 21 is a plane view showing the manufacturing method of the semiconductor device of an embodiment of the present invention.

Next, the silicon nitride oxide film 1509 is etched using a resist mask so that an opening 1473 and an opening 1474 may be formed in a connection portion between the conductive film 1422 and the power supply terminal 1312 and a connection portion between the conductive film 1423 and the power supply terminal 1311, respectively (see FIG. 16B and FIG. 21).

Next, a sealing film 1510 is formed as shown in FIG. 16B. The sealing film 1510 seals the top surface and sides of the integrated circuit. The thickness of the sealing film 1510 preferably is approximately 1 µm to 30 µm. The sealing film 1510 is preferably formed using a resin film so as to be formed thick as described above. Here, the sealing film 1510 including an opening 1471 and an opening 1472 (see FIG. 16B and FIG. 21) is formed so as to overlap with the opening 1473 and the opening 1474 which are connection portions to the power supply terminal 1311 and the power supply terminal 1312, respectively, by forming a photosensitive epoxy-phenol-based resin film using a printing method.

Next, the power supply terminal 1311 and the power supply terminal 1312 are formed over the sealing film 1510. FIG. 21 shows a layout of the power supply terminal 1311 and the power supply terminal 1312. FIG. 21 also shows the conductive films 1421 to 1423 for the third layer, the openings 1471 and 1472 formed in the sealing film 1510, and the openings 1473 and 1474 formed in the silicon nitride oxide film 1509.

In this embodiment, the power supply terminal 1311 and the power supply terminal 1312 are formed using a four-layer conductive film. First, conductive films 1461 for a first layer are formed by a printing method such as a screen printing method (see FIG. 17). In this embodiment, each of the conductive films 1461 is formed to a thickness of approximately 15 µm by a screen printing method by using a conductive paste containing nickel particles.

The conductive paste is a material in which metal particles or metal powders is dispersed into a binder made of resin. A conductive resin film is formed by solidifying such a conductive paste. Accordingly, the conductive films 1461 are formed using a conductive resin film and thus have poor adhesion to a solder. Therefore, in order to improve the adhesion of the power supply terminal 1311 and the power supply terminal 1312 to a solder, a conductive film in a given shape is formed on each top surface of the conductive films 1461 by a sputtering method using a metal mask. Here, a three-layer conductive film is formed over each of the conductive films 1461. Each of the conductive films 1462 for the first layer is a 150-nm-thick titanium film; each of the conductive films 1463 for the second layer is a 750-nm-thick nickel film; and each of the conductive films 1464 for the third layer is a 50-nm-thick Au film. Through these steps, the four-layer power supply terminal 1311 and the four-layer power supply terminal 1312 are completed (see FIG. 11).

Next, the glass substrate 1500 is cut so that individual photodetectors 1300 are obtained at the peripheries 1542 of the photodetector 1300 (the portions indicated by dotted lines in FIG. 16B). The glass substrate 1500 can be cut by a dicing method, a laser cutting method, or the like. Before the glass substrate 1500 is cut into individual photodetectors, the glass substrate 1500 can be made thinner by polishing or grinding a rear surface of the glass substrate 1500. This step is preferably performed before conductive films 1462 to 1464 are formed by sputtering. By making the glass substrate 1500 thinner, wearing out of a cutting tool used for cutting the glass substrate 1500 can be reduced. In addition, thinning of the glass substrate 1500 enables the photodetector to be thin. For example, the glass substrate 1500 having a thickness of approximately 0.5 mm can be thinned to a thickness of approximately 0.25 mm. In the case of making the glass substrate 1500 thinner, it is preferable the rear surface and the side surfaces of the glass substrate 1500 be covered with a resin film so that the glass substrate 1500 may be protected.

As described above, manufacturing a transistor in a functional circuit and a diode in a protection circuit concurrently is described in this embodiment. A diode in a protection circuit is preferably formed by using a semiconductor film which is formed in the same steps as a semiconductor film of a transistor as in this embodiment, in which case steps are not complicated. It is possible to improve resistance of a semiconductor device to the surge by concurrently forming a diode in a protection circuit and a transistor in a functional circuit and providing a protection circuit between a power supply terminal and an integrated circuit without causing wirings to branch as in this embodiment.

Embodiment 4

In Embodiment 3, a method of forming each functional circuit by using the crystalline semiconductor film obtained by crystallizing the amorphous semiconductor film is described. A semiconductor device which is one embodiment of the present invention can be formed using a single crystal semiconductor film formed over an insulating surface. In this embodiment, a method of forming a single crystal semiconductor film on an insulating surface is described.

A glass substrate 800 is prepared as shown in FIG. 22A. The glass substrate 800 is a support substrate that supports a single crystal semiconductor layer separated from a single crystal semiconductor substrate. It is preferable to use, as the glass substrate 800, a substrate having a coefficient of thermal expansion of $25 \times 10^{-7}$/° C. to $50 \times 10^{-7}$/° C. (preferably $30 \times 10^{-7}$/° C. to $40 \times 10^{-7}$/° C.) and a strain point of 580° C. to 680° C. (preferably 600° C. to 680° C.). In addition, in order to suppress the contamination of the functional circuit, a non-alkali glass substrate is preferably used as the glass substrate. Examples of the non-alkali glass substrate include an aluminosilicate glass substrate, an aluminoborosilicate glass substrate, a barium borosilicate glass substrate, and the like.

Instead of the glass substrate 800, an insulating substrate made of an insulator, such as a ceramic substrate, a quartz substrate, or a sapphire substrate; a conductive substrate made of a conductive substance such as metal or stainless steel; a semiconductor substrate made of a semiconductor such as silicon or gallium arsenide; or the like can be used.

A single crystal semiconductor substrate 801 is prepared as shown in FIG. 22B. An SOI substrate is formed by bonding a single crystal semiconductor film separated from the single crystal semiconductor substrate 801 to the glass substrate 800. For the single crystal semiconductor substrate 801, for example, a single crystal semiconductor substrate formed of a Group 14 element such as silicon, germanium, silicon germanium, or silicon carbide can be used. Further, in this embodiment, the glass substrate 800 is larger than the single crystal semiconductor substrate 801.

An insulating film 802 is formed over the single crystal semiconductor substrate 801 as shown in FIG. 22C. The insulating film 802 can have a single or multi-layer structure and have a thickness of 5 nm to 400 nm. As a film used for forming the insulating film 802, a film made of an insulator containing silicon or germanium as its component, such as silicon oxide, silicon nitride, silicon oxynitride, silicon nitride oxide, germanium oxide, germanium nitride, germanium oxynitride, and germanium nitride oxide can be used. Alternatively, an insulating film made of metal oxide such as aluminum oxide, tantalum oxide, or hafnium oxide; an insulating film made of metal nitride such as aluminum nitride; an insulating film made of metal oxynitride such as aluminum oxynitride; or an insulating film made of metal nitride oxide such as aluminum nitride oxide can be used. The insulating film used for forming the insulating film 802 can be formed by CVD, sputtering, or a method in which the single crystal semiconductor substrate 801 is, for example, oxidized or nitrided.

Further, it is preferable that at least one layer that is capable of preventing impurities from diffusing from the glass substrate 800 into the single crystal semiconductor film be provided in the insulating film 802. Examples of such a film include a silicon nitride film, a silicon nitride oxide film, an aluminum nitride film, an aluminum nitride oxide film, and the like. Providing such a film allows the insulating film 802 to function as a barrier layer.

For example, in the case of forming the insulating film 802 as a single-layer barrier layer, the insulating film 802 can be formed using a silicon nitride film, a silicon nitride oxide film, an aluminum nitride film, or an aluminum nitride oxide film with a thickness of 5 nm to 200 nm.

In the case where the insulating film 802 is a two-layer film serving as a barrier layer, an upper layer is formed using an insulating film having an excellent barrier function. For such an insulating film, a silicon nitride film, a silicon nitride oxide film, an aluminum nitride film, or an aluminum nitride oxide film with a thickness of 5 nm to 200 nm can be formed. These films have a high blocking effect for preventing impurity diffusion, but their internal stress is high. Therefore, it is preferable that a film that is capable of alleviating stress of the upper layer of the insulating film be selected as the lower layer of the insulating film that is in contact with the single crystal semiconductor substrate 801. Examples of such an insulating film include a silicon oxide film, a silicon oxynitride film, a thermal oxide film formed by thermal oxidation of the single crystal semiconductor substrate 801, and the like. The thickness of such an insulating film can be 5 nm to 300 nm.

In this embodiment, the insulating film 802 has a two-layer structure having an insulating film 802a and an insulating film 802b. A 100-nm-thick silicon oxynitride film is formed as the insulating film 802a by PECVD using $SiH_4$ and $N_2O$ as source gases, and a 50-nm-thick silicon nitride oxide film is formed as the insulating film 802b by PECVD using $SiH_4$, $N_2O$, and $NH_3$ as source gases.

Next, the single crystal semiconductor substrate 801 is irradiated with an ion beam 805 including ions accelerated by an electric field through the insulating film 802 so that an embrittlement layer 803 may be formed in a region at a predetermined depth from the surface of the single crystal semiconductor substrate 801 as shown in FIG. 22D. This ion irradiation step is a step of adding an element of the ion species into the single crystal semiconductor substrate 801 by irradiating the single crystal semiconductor substrate 801 with an ion beam 805 made of an accelerated ion species. When the single crystal semiconductor substrate 801 is irradiated with the ion beam 805, a layer in which a crystal structure is brittle is formed at a predetermined depth in the single crystal semiconductor substrate 801 by the impact of the accelerated ion species. This layer corresponds to the embrittlement layer 803. The depth at which the embrittlement layer 803 is formed can be adjusted by the acceleration energy of the ion beam 805 and the angle at which the ion beam 805 enters. The acceleration energy can be adjusted by an acceleration voltage, dosage, or the like. The embrittlement layer 803 can be formed at the same depth or substantially the same depth as the average penetration depth of ions. That is, the thickness of the single crystal semiconductor film separated from the single crystal semiconductor substrate 801 is determined on the basis of the depth at which the ions enter. The depth at which the embrittlement layer 803 is formed is 50 nm to 500 nm, preferably 50 nm to 200 nm.

In order for the single crystal semiconductor substrate 801 to be irradiated with the ion beam 805, an ion doping method in which mass separation is not performed can be employed instead of an ion implantation method in which mass separation is performed.

When hydrogen ($H_2$) is used as a source gas, $H^+$, $H_2^+$, and $H_3^+$ can be produced by exciting a hydrogen gas. The proportion of ion species generated from the source gas can be changed by adjusting a plasma excitation method, pressure in an atmosphere for generating plasma, the supply amount of the source gas, or the like. In the case of forming the embrittlement layer 803 by an ion doping method, it is preferable that $H_3^+$ account for 70% or more of the total amount of $H^+$, $H_2^+$, and $H_3^+$ in the ion beam 805, and it is more preferable that $H_3^+$ occupy 80% or more. In order to form the embrittlement layer 803 at a shallow region, it is necessary to lower the accelerating voltage of the ions. Further, by increasing the proportion of $H_3^+$ ions in the plasma produced by exciting the hydrogen gas, atomic hydrogen can be efficiently added to the single crystal semiconductor substrate 801.

In the case of performing ion irradiation using an ion doping method with the hydrogen gas, the acceleration voltage can be 10 kV to 200 kV, and the dosage can be $1\times10^{16}$ ions/cm$^2$ to $6\times10^{16}$ ions/cm$^2$. By irradiation with the hydrogen ions under this condition, the embrittlement layer 803 can be formed in a region at a depth of 50 nm to 500 nm in the single crystal semiconductor substrate 801 although depending on the ion species included in the ion beam 805 and the proportion thereof.

For example, in the case where the single crystal semiconductor substrate 801 is a single crystal silicon substrate, the insulating film 802a is a 50-nm-thick silicon oxynitride film, and the insulating film 802b is a 50-nm-thick silicon nitride oxide film, a single crystal silicon film having a thickness of approximately 120 nm can be separated from the single crystal semiconductor substrate 801 in the following condition; a hydrogen source gas, an accelerating voltage of 40 kV, and a dosage of $2\times10^{16}$ ions/cm$^2$. Alternatively, when the irradiation with the hydrogen ions is performed under the above condition except that the insulating film 802a is a 100-nm-thick silicon oxynitride film, a single crystal silicon film having a thickness of approximately 70 nm can be separated from the single crystal semiconductor substrate 801.

As the source gas used for the ion irradiation step, instead of hydrogen, helium (He) or a halogen gas such as a chlorine gas ($Cl_2$ gas) or a fluorine gas ($F_2$ gas) may be used.

After the embrittlement layer 803 is formed, an insulating film 804 is formed on a top surface of the insulating film 802, as shown in FIG. 22E. In the step of forming the insulating film 804, the single crystal semiconductor substrate 801 is preferably heated at a temperature of 350° C. or lower that does not cause an element or a molecule added to the embrittlement layer 803 to be precipitated. That is, this heat treatment is performed at a temperature that does not cause degassing of the embrittlement layer 803. Note that the insulating film 804 can be formed before the ion irradiation step. Here, the process temperature at the time of the formation of the insulating film 804 can be set to 350° C. or more.

The insulating film 804 is used for forming a bonding surface that is smooth and hydrophilic over the surface of the single crystal semiconductor substrate 801. The thickness of the insulating film 804 is preferably 5 nm to 500 nm, more preferably 10 nm to 200 nm. A silicon oxide film or a silicon oxynitride film can be formed as the insulating film 804. In this embodiment, a 50-nm-thick silicon oxide film is formed by PECVD using TEOS and $O_2$ as source gases.

Note that one of the insulating film 802 and the insulating film 804 is not necessarily formed. Further, a single or multi-layer insulating film may be formed over the glass substrate 800. This insulating film can be formed in a manner similar to that of the insulating film 802; in the case of a multi-layer structure, an insulating film that functions as a barrier layer is preferably formed so as to be in contact with the glass substrate 800. In addition, in the case where the insulating film is formed over the glass substrate 800, the insulating film 802 and the insulating film 804 are not necessarily formed.

FIG. 22F is a cross-sectional view for explaining a bonding step and shows a state where the glass substrate 800 and the single crystal semiconductor substrate 801 are attached to each other. For the bonding step, first, the glass substrate 800, and the single crystal semiconductor substrate 801 over which the insulating films 802 and 804 are formed are subjected to ultrasonic cleaning. The ultrasonic cleaning is preferably megahertz ultrasonic cleaning (megasonic cleaning). After the megahertz ultrasonic cleaning, one or both of the glass substrate 800 and the single crystal semiconductor substrate 801 can be cleaned with ozone water. Cleaning with ozone water promotes removal of organic substances and allows the surface to be more hydrophilic.

After the cleaning step, the glass substrate 800 and the single crystal semiconductor substrate 801 are bonded to each other with the insulating film 804 therebetween. The surface of the glass substrate 800 and the surface of the insulating film 804 are firmly attached to each other, which leads to formation of a chemical bond in an interface between the glass substrate 800 and the insulating film 804, so that the glass substrate 800 and the insulating film 804 are bonded to each other. The bonding step can be performed at normal temperature without heat treatment; therefore, a low-heat-resistant substrate such as the glass substrate 800 can be used as a substrate to which the single crystal semiconductor substrate 801 is to be attached.

In order to increase the bonding strength between the glass substrate 800 and the insulating film 804, heat treatment is preferably performed after the glass substrate 800 and the single crystal semiconductor substrate 801 are attached to each other. This process temperature is a temperature that does not cause a crack in the embrittlement layer 803, and thus can be 70° C. to 300° C., for example.

Next, heat treatment at 400° C. or higher is performed to divide the single crystal semiconductor substrate 801 at the embrittlement layer 803, so that a single crystal semiconductor film 806 is separated from the single crystal semiconductor substrate 801. FIG. 22G is a diagram showing a separation step in which the single crystal semiconductor film 806 is separated from the single crystal semiconductor substrate 801. The single crystal semiconductor film 806 is formed over the glass substrate 800 in the separation step as shown in FIG. 22G. An element denoted by reference numeral 801A refers to the single crystal semiconductor substrate 801 from which the single crystal semiconductor film 806 has been separated.

With the heat treatment at 400° C. or higher, hydrogen bonding formed at the bonding interface between the glass substrate 800 and the insulating film 804 turns into covalent binding, resulting in the increase in the bonding strength. Further, the increase in the temperature causes the elements added in the ion irradiation step to be precipitated onto microvoids formed in the embrittlement layer 803, leading to the increase in internal pressure. The increase in the pressure produces volume changes in the microvoids in the embrittlement layer 803, which causes a crack in the embrittlement layer 803. Thus, the single crystal semiconductor substrate 801 is divided along the embrittlement layer 803. Since the insulating film 804 is bonded to the glass substrate 800, the single crystal semiconductor film 806 separated from the single crystal semiconductor substrate 801 is fixed over the glass substrate 800. A temperature of the heat treatment for separating the single crystal semiconductor film 806 from the single crystal semiconductor substrate 801 is 400° C. to 700° C. which does not exceed the strain point of the glass substrate 800.

After the separation step shown in FIG. 22G is completed, an SOI substrate 810 in which the single crystal semiconductor film 806 is attached to the glass substrate 800 is formed. The SOI substrate 810 has a multi-layer structure in which the insulating film 804, the insulating film 802, and the single crystal semiconductor film 806 are layered in the order presented over the glass substrate 800. The SOI substrate 810 has the insulating film 802 and the insulating film 804 bonded to each other. In the case where the insulating film 802 is not formed, the SOI substrate 810 has the insulating film 804 and the single crystal semiconductor film 806 bonded to each other.

Note that the heat treatment for separating the single crystal semiconductor film 806 from the single crystal semiconductor substrate 801 can be successively performed with the apparatus used for the heat treatment for increasing the bonding strength. Alternatively, the two heat treatments can be performed with different apparatuses. For example, in the case of using the same furnace, first, heat treatment is performed at 200° C. for 2 hours. Subsequently, the temperature is raised to 600° C., and heat treatment is performed at 600° C. for 2 hours. Then, the temperature is decreased from 400° C. or less to on the order of room temperature, and the single crystal semiconductor substrate 801A and the SOI substrate 810 are taken out of the furnace.

In the case where the two heat treatments are performed with different apparatuses, heat treatment at 200° C. for 2 hours, for example, is performed with a furnace, and then, the glass substrate 800 and the single crystal semiconductor substrate 801, which are bonded to each other, are taken out of the furnace. Then, heat treatment at a temperature of 600° C. to 700° C. for 1 minute to 30 minutes is performed with a lamp annealing apparatus to divide the single crystal semiconductor substrate 801 at the embrittlement layer 803.

The single crystal semiconductor film 806 in the SOI substrate 810 has crystal defects that result from, for example, the formation and separation steps of the embrittlement layer 803. Further, the single crystal semiconductor film 806 has the surface whose flatness is degraded. Therefore, in order to reduce the crystal defects and obtain flatness, it is preferable that the single crystal semiconductor film 806 be irradiated with a laser light to be melted and thus recrystallized. Alternatively, in order to remove the damage to the surface of the single crystal semiconductor film 806 so that the surface may be flattened, it is preferable to polish the surface of the single crystal semiconductor film 806 by a chemical mechanical polishing (CMP) apparatus or the like.

A variety of semiconductor devices such as a photodetector having a SOI structure can be manufactured by using the SOI substrate 810 in this embodiment.

Embodiment 5

By attaching the photodetector in Embodiment 3 to electronic devices, the operation of the electronic devices can be controlled in accordance with a digital signal of the photodetector. For example, by incorporating the photoelectric conversion device in an electronic device provided with a display panel, the illuminance of usage environment can be measured by the photodetector and the luminance of the display panel can be adjusted using a digital signal obtained by the photodetector. In this embodiment, examples of such an electronic device will be described using FIGS. 23A to 23E.

Figure 23A:
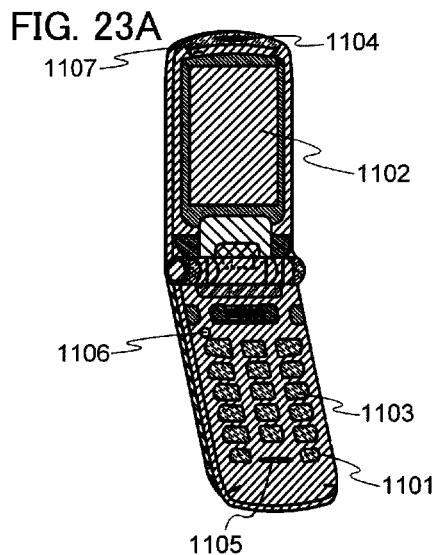
FIGS. 23A to 23E each show an electronic device of an embodiment of the present invention.

FIG. 23A shows an external view of a mobile phone. The mobile phone in FIG. 23A includes a main body 1101, a display panel 1102, operation keys 1103, an audio output portion 1104, and an audio input portion 1105. Further, the main body 1101 is provided with a photodetector 1106. The mobile phone in FIG. 23A has a function of adjusting the luminance of the display panel 1102 in accordance with output signals from the photodetector 1106. Further, a photodetector 1107 for detecting the luminance of the backlight of the display panel 1102 is incorporated in the main body 1101.

Figure 23B:
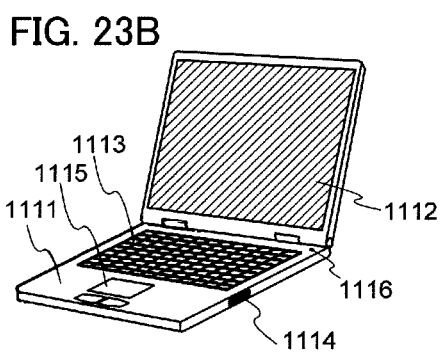

FIG. 23B shows an external view of a computer. The computer includes a main body 1111, a display panel 1112, a keyboard 1113, an external connection port 1114, a pointing device 1115, and the like. Further, a photodetector 1116 for detecting the luminance of the backlight of the display panel 1112 is incorporated in the main body 1111.

Figure 23C:
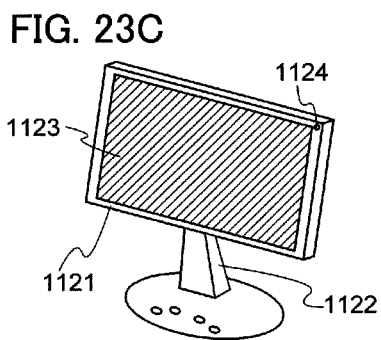

FIG. 23C shows an external view of a display device. The display device corresponds to a TV set, a monitor of a computer, or the like. The display device includes a housing 1121, a supporting base 1122, a display panel 1123, and the like. A photodetector 1124 for detecting the luminance of a backlight of the display panel 1123 is incorporated in the housing 1121.

Figure 23D:
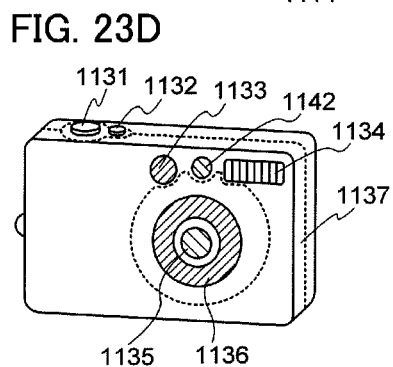
Figure 23E:
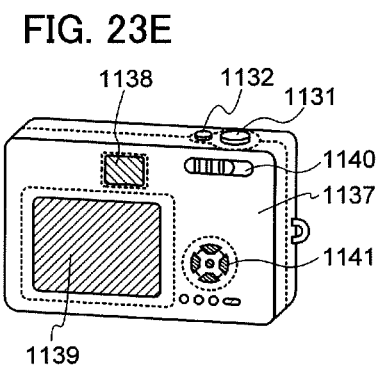

FIG. 23D shows an external view of a digital camera when viewed from front. FIG. 23E shows an external view of the digital camera when viewed from back. The digital camera includes a release button 1131, a main switch 1132, a view finder window 1133, a flashlight 1134, a lens 1135, a lens barrel 1136, a housing 1137, a view finder eyepiece 1138, a display panel 1139, a shooting mode select switch 1140, an operation button 1141, and the like. By mounting a photodetector 1142 on the digital camera, the illuminance of a shooting environment can be detected by the photodetector. Exposure, shutter speed, and the like can be adjusted in accordance with electrical signals detected by the photodetector.

This application is based on Japanese Patent Application serial no. 2009-154099 filed with Japan Patent Office on Jun. 29, 2009, the entire contents of which are hereby incorporated by reference.

What is claimed is:

1. A semiconductor device comprising over a substrate:
   a terminal electrode;
   a protection circuit;
   an integrated circuit; and
   a wiring electrically connecting the terminal electrode, the protection circuit, and the integrated circuit,
   wherein the protection circuit is provided between the terminal electrode and the integrated circuit, and
   wherein the wiring does not branch when seen in a plan view.

2. The semiconductor device according to claim 1, wherein power supply voltage is configured to be applied to the terminal electrode.

3. The semiconductor device according to claim 1, wherein the protection circuit includes a diode.

4. The semiconductor device according to claim 1, wherein the protection circuit includes a semiconductor film.

5. The semiconductor device according to claim 1, wherein the terminal electrode and the wiring are formed using the same conductive layer.

6. The semiconductor device according to claim 1, wherein the semiconductor device is a photodetector.

7. The semiconductor device according to claim 1, wherein the semiconductor device is incorporated into an electronic device selected from the group consisting of a mobile phone, a computer, a display device, and a digital camera.

8. A semiconductor device comprising at least:
   a first terminal electrode;

a second terminal electrode;
an integrated circuit;
a first wiring not branching when seen in a plan view and electrically connecting the first terminal electrode to a first region of the integrated circuit;
a second wiring not branching when seen in the plan view and electrically connecting the second terminal electrode to a second region of the integrated circuit;
a protection circuit; and
wherein at least a part of the first wiring placed between the first terminal electrode and the integrated circuit is electrically connected to a first portion of the protection circuit, and
wherein at least a part of the second wiring placed between the second terminal electrode and the integrated circuit is electrically connected to a second portion of the protection circuit.

9. The semiconductor device according to claim 8, wherein power supply voltage is configured to be applied to the first terminal electrode.

10. The semiconductor device according to claim 8, wherein the protection circuit includes a diode.

11. The semiconductor device according to claim 8, wherein the protection circuit includes a semiconductor film.

12. The semiconductor device according to claim 8, wherein the first terminal electrode and the first wiring are formed using the same conductive layer.

13. The semiconductor device according to claim 8, wherein the semiconductor device is a photodetector.

14. The semiconductor device according to claim 8, wherein the semiconductor device is incorporated into an electronic device selected from the group consisting of a mobile phone, a computer, a display device, and a digital camera.

15. The semiconductor device according to claim 8, wherein the first wiring and the second wiring cross each other when seen in the plan view.

16. A semiconductor device comprising at least:
a first terminal electrode;
a second terminal electrode;
an integrated circuit;
a first wiring not branching when seen in a plan view and connecting the first terminal electrode to a first region of the integrated circuit;
a second wiring not branching when seen in the plan view and connecting the second terminal electrode to a second region of the integrated circuit;
a third wiring part of the second wiring; and
a protection circuit,
wherein at least a part of the first wiring placed between the first terminal electrode and the integrated circuit is electrically connected to a first portion of the protection circuit,
wherein at least a part of the second wiring placed between the second terminal electrode and the integrated circuit is electrically connected to a second portion of the protection circuit, and
wherein the first terminal electrode overlaps with the third wiring with an insulating film interposed therebetween.

17. The semiconductor device according to claim 16, wherein power supply voltage is configured to be applied to the first terminal electrode.

18. The semiconductor device according to claim 16, wherein the protection circuit includes a diode.

19. The semiconductor device according to claim 16, wherein the protection circuit includes a semiconductor film.

20. The semiconductor device according to claim 16, wherein the first terminal electrode and the first wiring are formed using the same conductive layer.

21. The semiconductor device according to claim 16, wherein the semiconductor device is a photodetector.

22. The semiconductor device according to claim 16, wherein the semiconductor device is incorporated into an electronic device selected from the group consisting of a mobile phone, a computer, a display device, and a digital camera.

23. The semiconductor device according to claim 8, further comprising:
a third wiring overlapping with the first wiring with an insulating layer interposed therebetween,
wherein the second wiring comprises a first sub-wiring and a second sub-wiring, and
wherein the third wiring electrically connects the first sub-wiring to the second sub-wiring.

* * * * *